(12) United States Patent
Kitao et al.

(10) Patent No.: US 11,296,109 B2
(45) Date of Patent: Apr. 5, 2022

(54) METHOD FOR MANUFACTURING SEMICONDUCTOR DEVICE

(71) Applicant: KIOXIA CORPORATION, Tokyo (JP)

(72) Inventors: Ryohei Kitao, Yokkaichi Mie (JP);
Atsuko Sakata, Yokkaichi Mie (JP);
Takeshi Ishizaki, Nagoya Aichi (JP);
Satoshi Wakatsuki, Yokkaichi Mie (JP); Shinichi Nakao, Yokkaichi Mie (JP); Shunsuke Ochiai, Yokkaichi Mie (JP); Kei Watanabe, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 239 days.

(21) Appl. No.: 16/718,239

(22) Filed: Dec. 18, 2019

(65) Prior Publication Data

US 2020/0127007 A1    Apr. 23, 2020

Related U.S. Application Data

(62) Division of application No. 15/195,482, filed on Jun. 28, 2016, now Pat. No. 10,541,250.

(60) Provisional application No. 62/272,401, filed on Dec. 29, 2015.

(51) Int. Cl.
*H01L 27/00* (2006.01)
*H01L 27/11582* (2017.01)
*H01L 29/66* (2006.01)

(52) U.S. Cl.
CPC .. *H01L 27/11582* (2013.01); *H01L 29/66833* (2013.01)

(58) Field of Classification Search
CPC ............... H01L 27/11582; H01L 29/66833
See application file for complete search history.

(56) References Cited

U.S. PATENT DOCUMENTS

| 8,956,982 B2 | 2/2015 | Tsubata et al. |
| 2002/0179570 A1 | 12/2002 | Mathad |
| 2011/0159411 A1 | 6/2011 | Olson |
| 2012/0244712 A1 | 9/2012 | Tsubata et al. |
| 2014/0273470 A1 | 9/2014 | Lin |

(Continued)

FOREIGN PATENT DOCUMENTS

| JP | 2003-187419 A | 9/2013 |
| JP | 2013-197419 | 9/2013 |
| JP | 2017-5178 A | 1/2017 |

*Primary Examiner* — Mounir S Amer
*Assistant Examiner* — Alexander Belousov
(74) *Attorney, Agent, or Firm* — Finnegan, Henderson, Farabow, Garrett & Dunner L.L.P.

(57) ABSTRACT

A method of manufacturing a semiconductor device according to one embodiment includes forming a first film including a first metal above a processing target member. The method includes forming a second film including two or more types of element out of a second metal, carbon, and boron above the first film. The method includes forming a third film including the first metal above the second film. The method includes forming a mask film by providing an opening part to a stacked film including the first film, the second film and the third film. The method includes processing the processing target member by performing etching using the mask film as a mask.

19 Claims, 20 Drawing Sheets

(56) References Cited

U.S. PATENT DOCUMENTS

| | | | |
|---|---|---|---|
| 2015/0056811 A1 | 2/2015 | Kondoh et al. | |
| 2015/0221547 A1* | 8/2015 | Arnold | H01L 21/76811 |
| | | | 438/618 |
| 2016/0365249 A1 | 12/2016 | Nakao et al. | |

* cited by examiner

METHOD FOR MANUFACTURING SEMICONDUCTOR DEVICE

CROSS-REFERENCE TO RELATED APPLICATIONS

This application is a divisional of U.S. patent application Ser. No. 15/195,482, filed Jun. 28, 2016, which is based upon and claims the benefit of priority from U.S. Provisional Patent Application 62/272,401, filed on Dec. 29, 2015; the entire contents of which are incorporated herein by reference.

FIELD

Embodiments relate to a method for manufacturing a semiconductor device.

BACKGROUND

In recent years, there has been proposed a stacked-type semiconductor memory device having memory cells integrated three-dimensionally. When manufacturing such a stacked-type semiconductor memory device, memory holes penetrating a stacked body are formed by etching. On this occasion, if the number of layers stacked in the stacked body increases, the aspect ratio of the memory hole becomes high, and therefore, a high etching resistance is required for the etching mask.

DETAILED DESCRIPTION

A method of manufacturing a semiconductor device according to one embodiment includes forming a first film including a first metal above a processing target member. The method includes forming a second film including two or more types of element out of a second metal, carbon, and boron above the first film. The method includes forming a third film including the first metal above the second film. The method includes forming a mask film by providing an opening part to a stacked film including the first film, the second film and the third film. The method includes processing the processing target member by performing etching using the mask film as a mask.

First Embodiment

Firstly, a first embodiment will be described. FIG. 1 through FIG. 9 are cross-sectional views showing a method of manufacturing a semiconductor device according to the embodiment.

Figure 10:
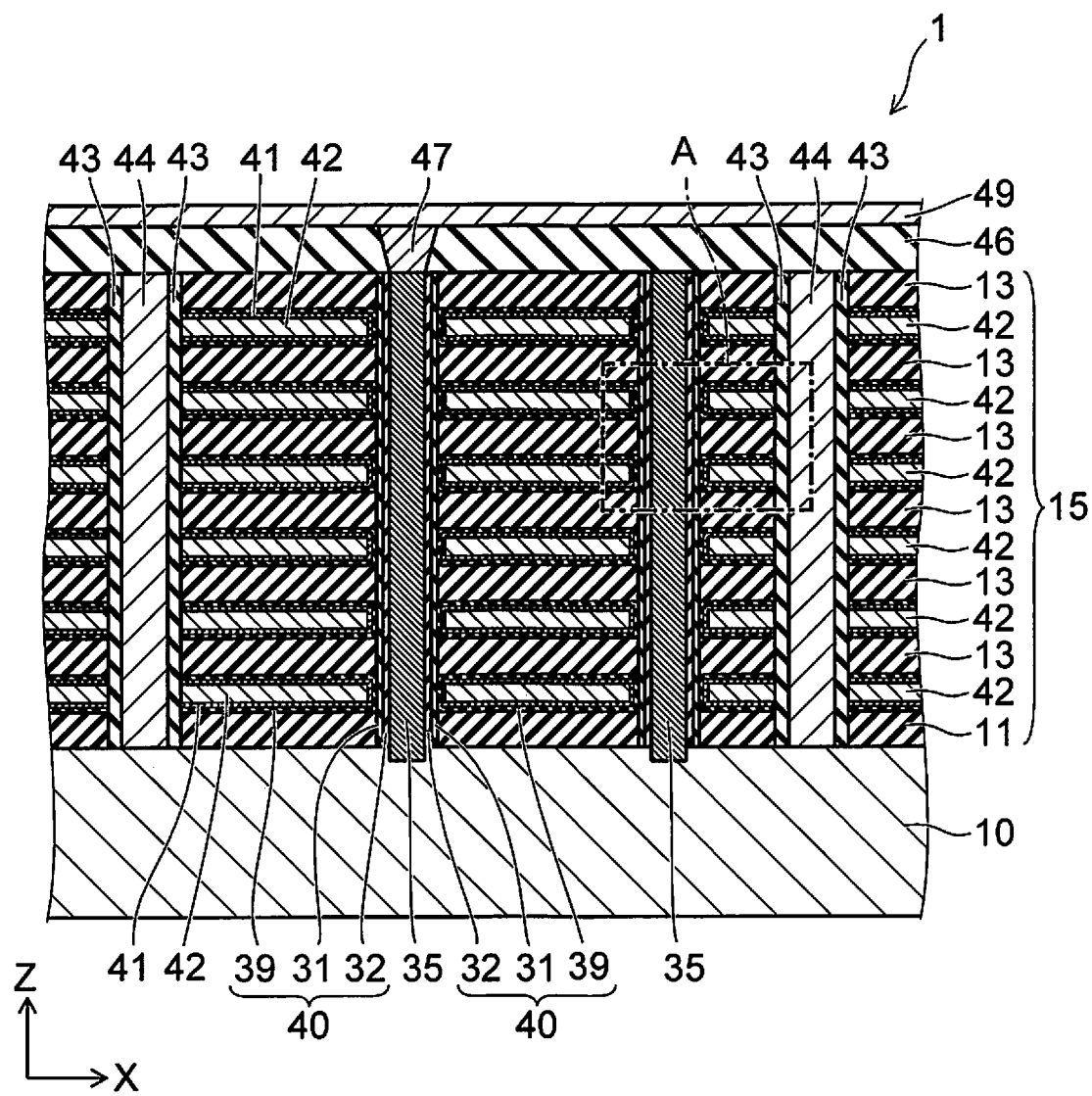
FIG. 10 is a cross-sectional view showing the semiconductor device according to the first embodiment.

FIG. 10 is a cross-sectional view showing the semiconductor device according to the embodiment.

Figure 11:
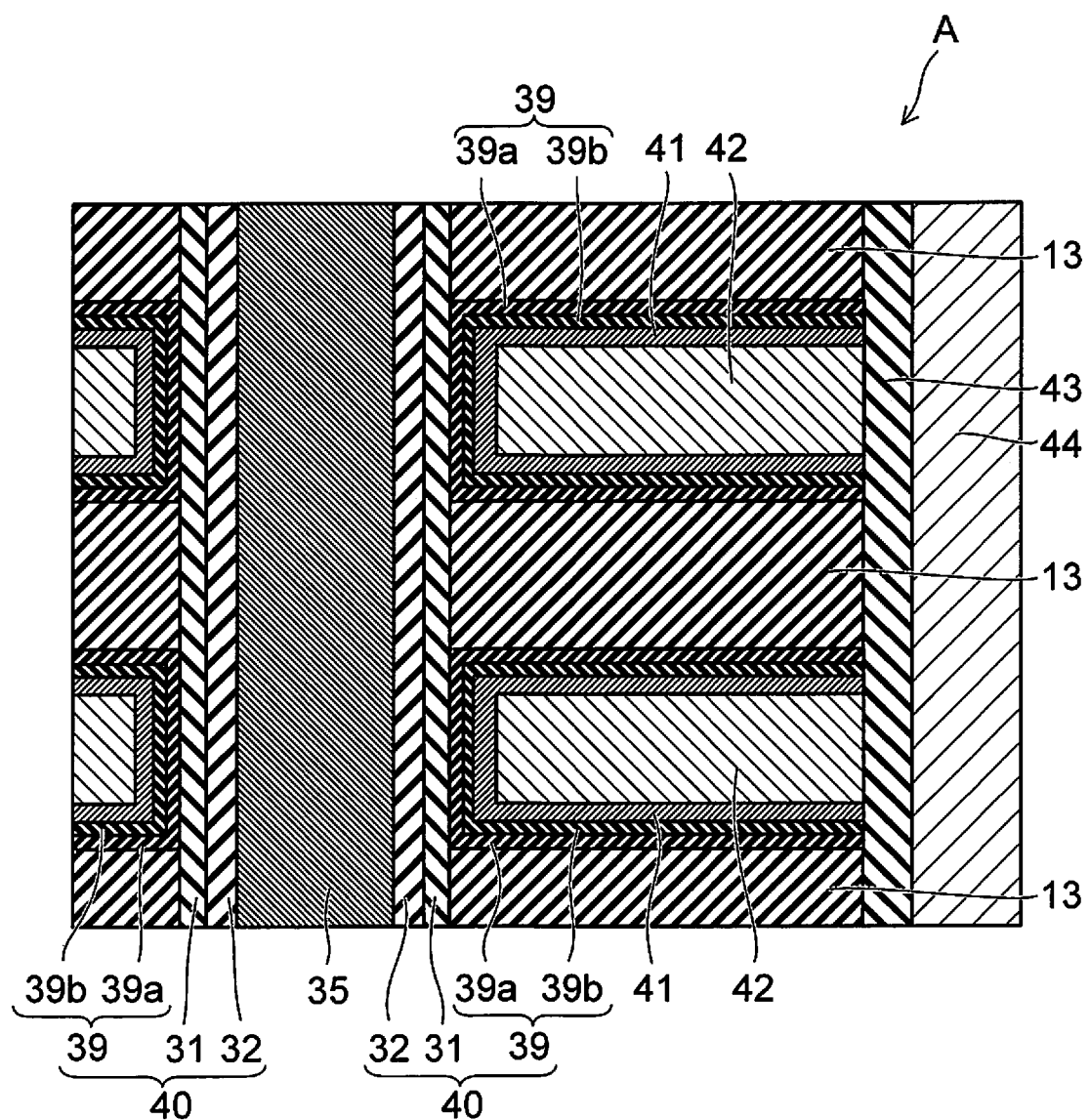
FIG. 11 is a cross-sectional view showing an area A of FIG. 10.

FIG. 11 is a cross-sectional view showing an area A of FIG. 10.

Figure 12:
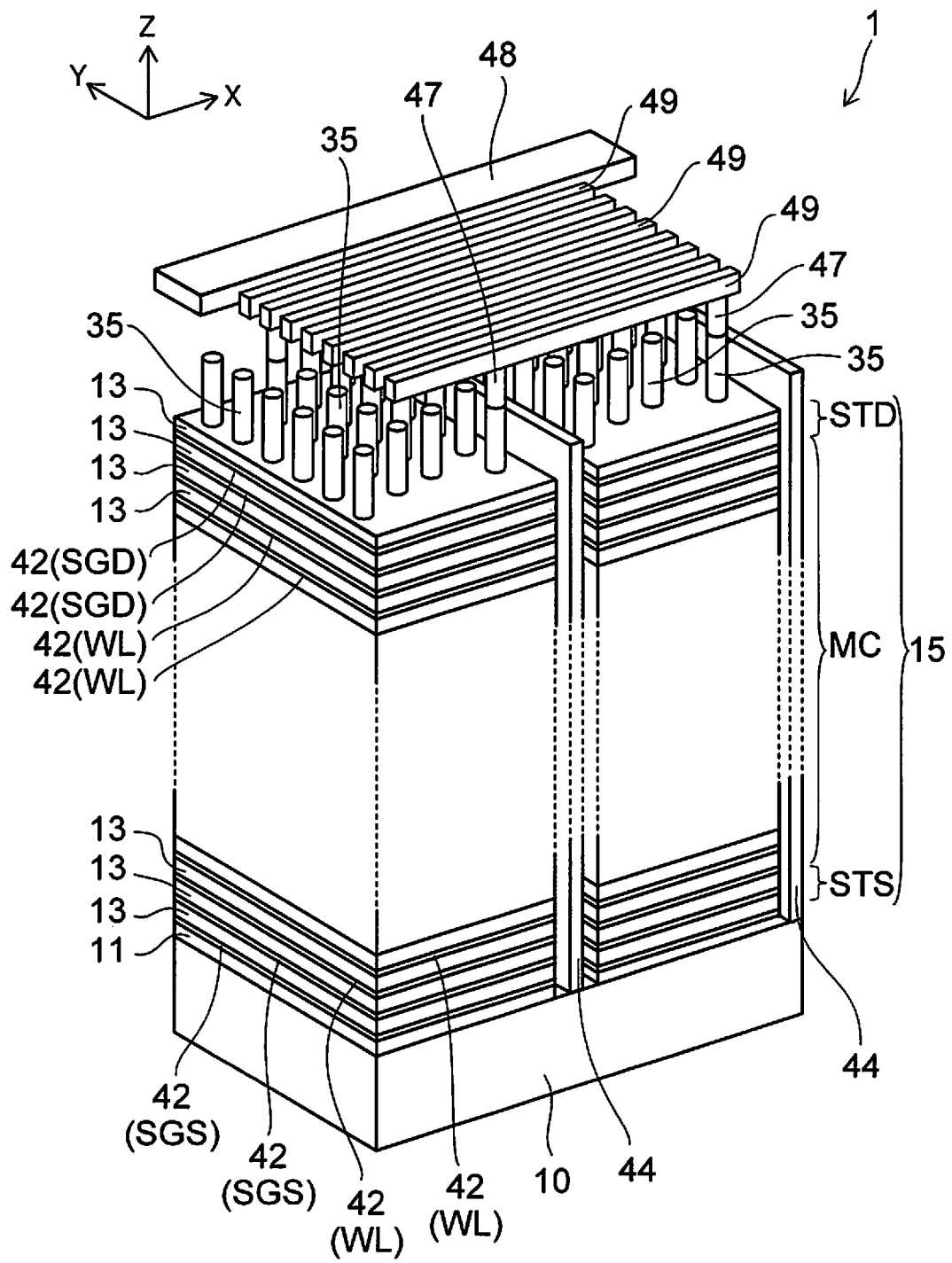
FIG. 12 is a perspective view showing the semiconductor device according to the first embodiment.

FIG. 12 is a perspective view showing the semiconductor device according to the embodiment.

The semiconductor device according to the embodiment is a stacked-type nonvolatile semiconductor memory device.

Firstly, a method of manufacturing the semiconductor device according to the embodiment will be described.

Figure 1:
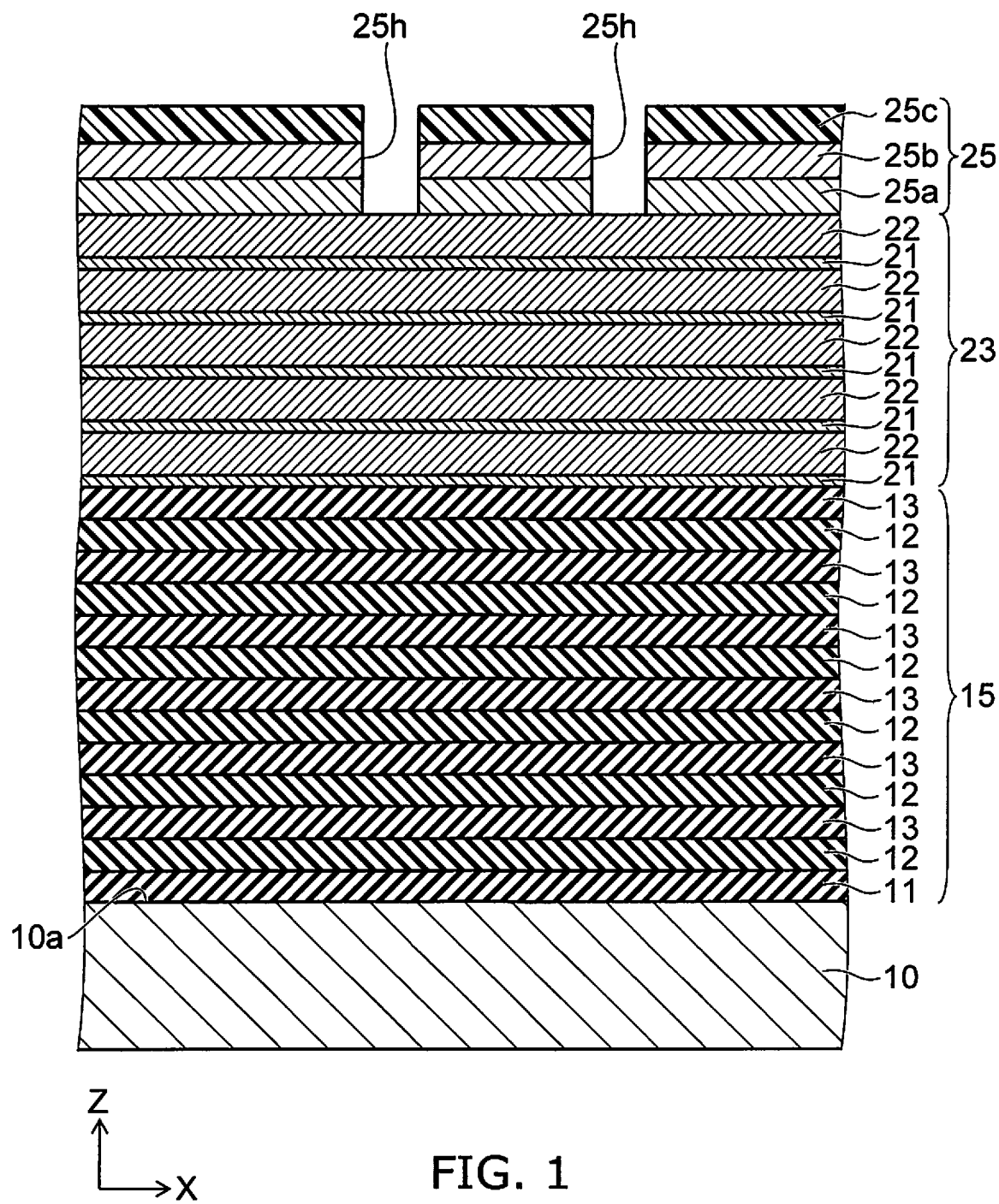
FIG. 1 through FIG. 9 are cross-sectional views showing a method of manufacturing a semiconductor device according to a first embodiment.

As shown in FIG. 1, a silicon substrate 10 is prepared. The silicon substrate 10 is a part of a silicon wafer. Hereinafter, in the specification, for the sake of convenience of explanation, there is adopted an XYZ Cartesian coordinate system. Two directions parallel to an upper surface 10a of the silicon substrate 10, and perpendicular to each other are defined as an "X-direction" and a "Y-direction," and a direction perpendicular to the upper surface 10a of the silicon substrate 10 is defined as a "Z-direction."

Firstly, a silicon oxide film 11 is formed on the silicon substrate 10. It should be noted that in the specification, the "silicon oxide film" denotes a film consisting primarily of a silicon oxide. Therefore, the silicon oxide film 11 includes silicon (Si) and oxygen (O). Further, since the silicon oxide is generally an insulating material, the silicon oxide film is an insulating film unless particularly explained. The same also applies to other constituents, and in the case in which the name of a material is included in the name of a constituent, the principal component of the constituent is the material.

Then, silicon nitride films 12 and silicon oxide films 13 are alternately formed on the silicon oxide film 11. On this occasion, it is arranged that the uppermost layer is the silicon oxide film 13. The silicon nitride films 12 are each a sacrifice film to be removed in a later process. The silicon oxide film 11, the plurality of silicon nitride films 12, and the plurality of silicon oxide films 13 constitute the stacked body 15. It should be noted that in FIG. 1, just six pairs each formed of the silicon nitride film 12 and the silicon oxide film 13 are shown for the sake of convenience of graphical description, but this configuration is not a limitation, and several tens of pairs, or several hundreds of pairs, for example, can be stacked on one another. The thickness, namely the length in the Z-direction, of the stacked body 15 is set to, for example, 2 through 4 (micrometers).

Then, a resist mask (not shown) is formed on the stacked body 15. Then, by alternately performing etching using the resist mask as a mask, and sliming of the resist mask, an end part of the stacked body 15 in the Y-direction is processed to have a stepped shape. Then, by depositing the silicon oxide on the entire surface, and then performing a planarization process such as CMP (Chemical Mechanical Polishing) on the upper surface, an interlayer insulating film (not shown) covering the end part of the stacked body 15 is formed on the silicon substrate 10.

Then, a carbon-containing tungsten film 21 consisting primarily of tungsten (W) and including carbon (C) is formed on the stacked body 15. For example, the carbon-containing tungsten film 21 has contact with the silicon oxide film 13 constituting the uppermost layer of the stacked body 15. The carbon concentration in the carbon-containing tungsten film 21 is set to such a concentration that a compound (W—C alloy) of tungsten and carbon is formed, but single-phase carbon is not precipitated, and is set to, for example, 1 atomic percent or higher, and 50 atomic percent or lower.

The carbon-containing tungsten film 21 is formed using, for example, a CVD (Chemical Vapor Deposition) method such as a PECVD (Plasma Enhanced CVD) method. On this occasion, it is possible to use tungsten hexafluoride ($WF_6$) as a source gas of tungsten, propylene ($C_3H_6$) as a source gas of carbon, and hydrogen ($H_2$) as a reducing gas, for example.

As the source gas of tungsten, an inorganic-system gas such as tungsten hexachloride ($WCl_6$) or tungsten hexacarbonyl ($W(CO)_6$) can also be used. Alternatively, an organic-system gas can also be used as the source gas of tungsten. As the organic-system gas, there can be used, for example, bis (cyclopentadienyl) tungsten(IV) dihydride ($C_{10}H_{12}W$), cyclopentadienyltungsten(II) tricarbonyl hydride ($C_8H_6O_3W$), bis (tert-butylimino) bis (tert-butylamino) tungsten (($C_4H_9NH)_2W(C_4H_9N)_2$), tetracarbonyl (1,5-cyclooctadiene) tungsten(0) ($C_{12}H_{12}O_4W$), triamminetungsten (IV) tricarbonyl (($NH_3)_3W(CO)_3$), tungsten(0) pentacarbonyl-N-pentylisonitrile (($CO)_5WCN(CH_2)_4CH_3$), bis (isopropylcyclopentadienyl) tungsten(IV) dihydride (($C_5H_4CH(CH_3)_2)_2WH_2$), bis (tert-butylimino) bis (dimethylamino) tungsten(VI) ((($CH_3)_3CN)_2W(N(CH_3)_2)_2$), bis (butylcyclopentadienyl) tungsten(IV) diiodide ($C_{18}H_{26}I_2W$), or bis (cyclopentadienyl) tungsten(IV) dichloride ($C_{10}H_{10}Cl_2W$). Further, as the source gas of carbon, there can be used acetylene ($C_2H_2$), ethylene ($C_2H_4$), or methane ($CH_4$).

Then, a tungsten film 22 made of tungsten is formed on the carbon-containing tungsten film 21 using, for example, a CVD method such as a PECVD method. As the source gas of tungsten, there is used the gas described above. The tungsten film 22 is formed to be thicker than the carbon-containing tungsten film 21. It should be noted that the carbon-containing tungsten film 21 and the tungsten film 22 can also be formed using a sputtering method. In this case, the carbon-containing film 21 and the tungsten film 22 are separately formed by, for example, switching the target.

Thereafter, the carbon-containing tungsten films 21 and the tungsten films 22 are alternately formed to form a stacked film 23. For example, in the stacked film 23, the carbon-containing tungsten films 21 and the tungsten films 22 are arranged at intervals along the Z-direction. The carbon-containing tungsten films 21 and the tungsten films 22 can also be deposited using respective deposition methods different from each other. However, in order to enhance the productivity, it is preferable to continuously deposit the both films in the same device without breaking a vacuum.

Figure 2:
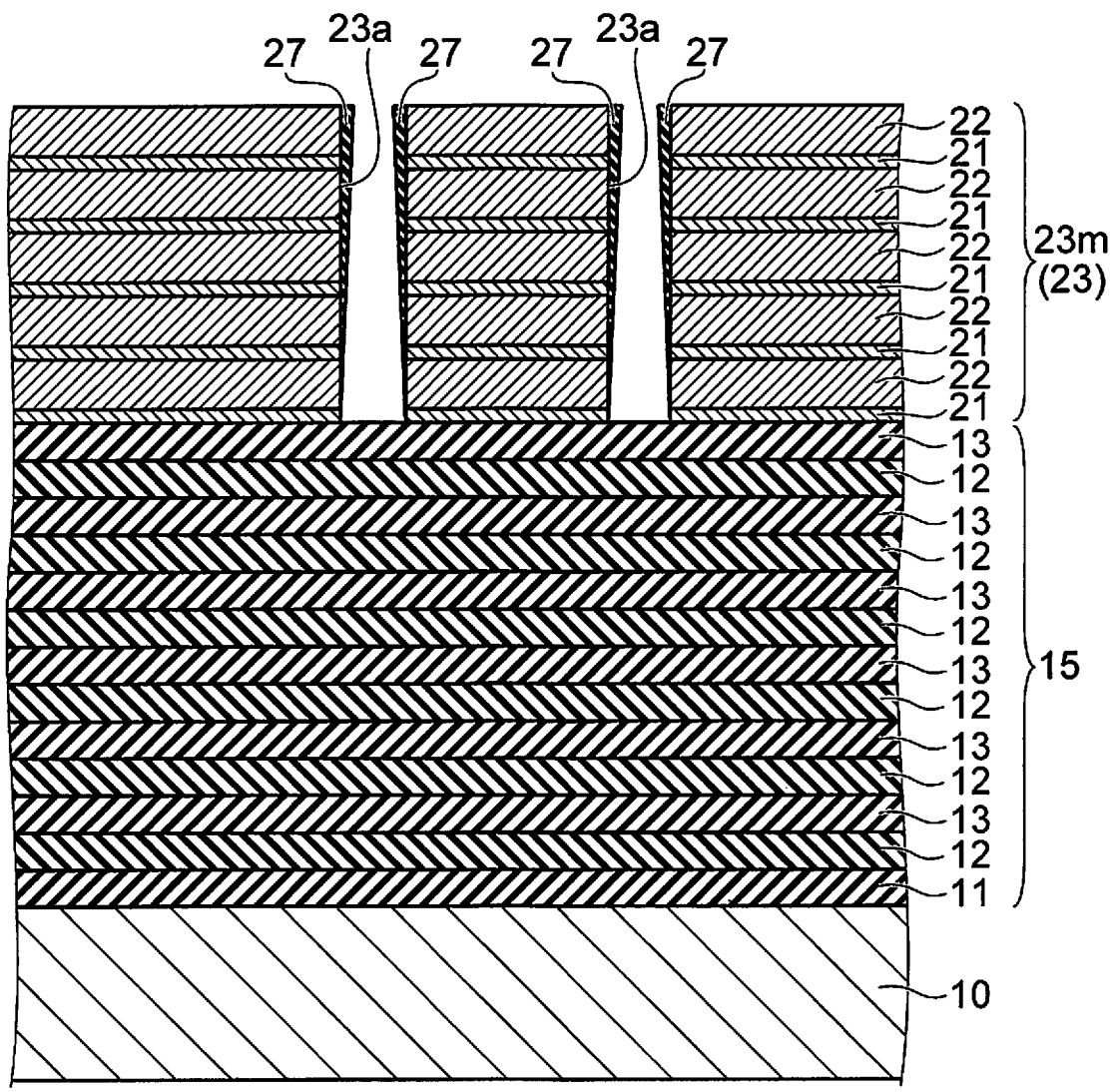

It should be noted that just five pairs each formed of the carbon-containing tungsten film 21 and the tungsten film 22 are shown in FIG. 1 and FIG. 2 for the sake of convenience of graphical description, but this configuration is not a limitation. In one example, the thickness of each of the carbon-containing tungsten films 21 is set to 10 nm (nanometers), the thickness of each of the tungsten films 22 is set to 40 nm, and the ten pairs each formed of the carbon-containing tungsten film 21 and the tungsten film 22 are formed to set the total thickness of the stacked film 23 to 500 nm. In the tungsten film 22, carbon may inevitably diffuse from the carbon-containing tungsten film 21 in some cases, but the carbon concentration in the tungsten film 22 is lower than the carbon concentration in the carbon-containing tungsten film 21.

The stacked film 23 is not a single-layer tungsten film, but a multilayer film obtained by inserting the carbon-containing tungsten films 21 between the respective tungsten films 22. Therefore, compared to the case of forming a thick single-layer tungsten film, the compressive stress of the stacked film 23 can be relaxed. Thus, the warp of the silicon wafer due to the formation of the stacked film 23, and exfoliation between the stacked body 15 and the stacked film 23 can be inhibited. In the following description, in some cases, the tungsten film 22 is referred to as a "metal film" in a broader concept, and the carbon-containing tungsten film 21 is referred to as a "stress-decoupling film" in a broader concept.

Then, an amorphous silicon layer 25a, an antireflection layer 25b, and a resist layer 25c are formed on the stacked film 23. Then, the antireflection layer 25b and the amorphous silicon layer 25a are patterned by patterning the resist layer 25c using a lithography method, and then performing etching using the resist layer 25c as a mask. Thus, there is formed a plurality of opening parts 25h each penetrating the resist layer 25c, the antireflection layer 25b, and the amorphous silicon layer 25a. It is assumed that, when viewed from the Z-direction, for example, the opening parts 25h are arranged in a zigzag manner, and the shape of each of the opening parts 25h is a circular shape. In such a manner, a mask 25 is formed. It should be noted that it is also possible to form an inorganic insulating material layer or an organic material layer instead of the amorphous silicon layer 25a. Alternatively, it is also possible to form the mask 25 by combining these layers.

Then, as shown in FIG. 2, by performing anisotropic etching using the mask 25, the stacked film 23 is patterned. As the anisotropic etching, there is performed RIE (Reactive Ion Etching) using an etching gas including, for example, fluorine and bromine. Thus, opening parts 23a each penetrating the stacked film 23 in the Z-direction are provided to the stacked film 23, and thus, a stacked mask film 23m is formed. On this occasion, if the carbon-containing tungsten film 21 is etched, a reaction product including carbon is generated, and adheres to an inner surface of each of the opening parts 23a. Thus, a protective film 27 is formed on the inner surface of each of the opening parts 23a.

Figure 3:
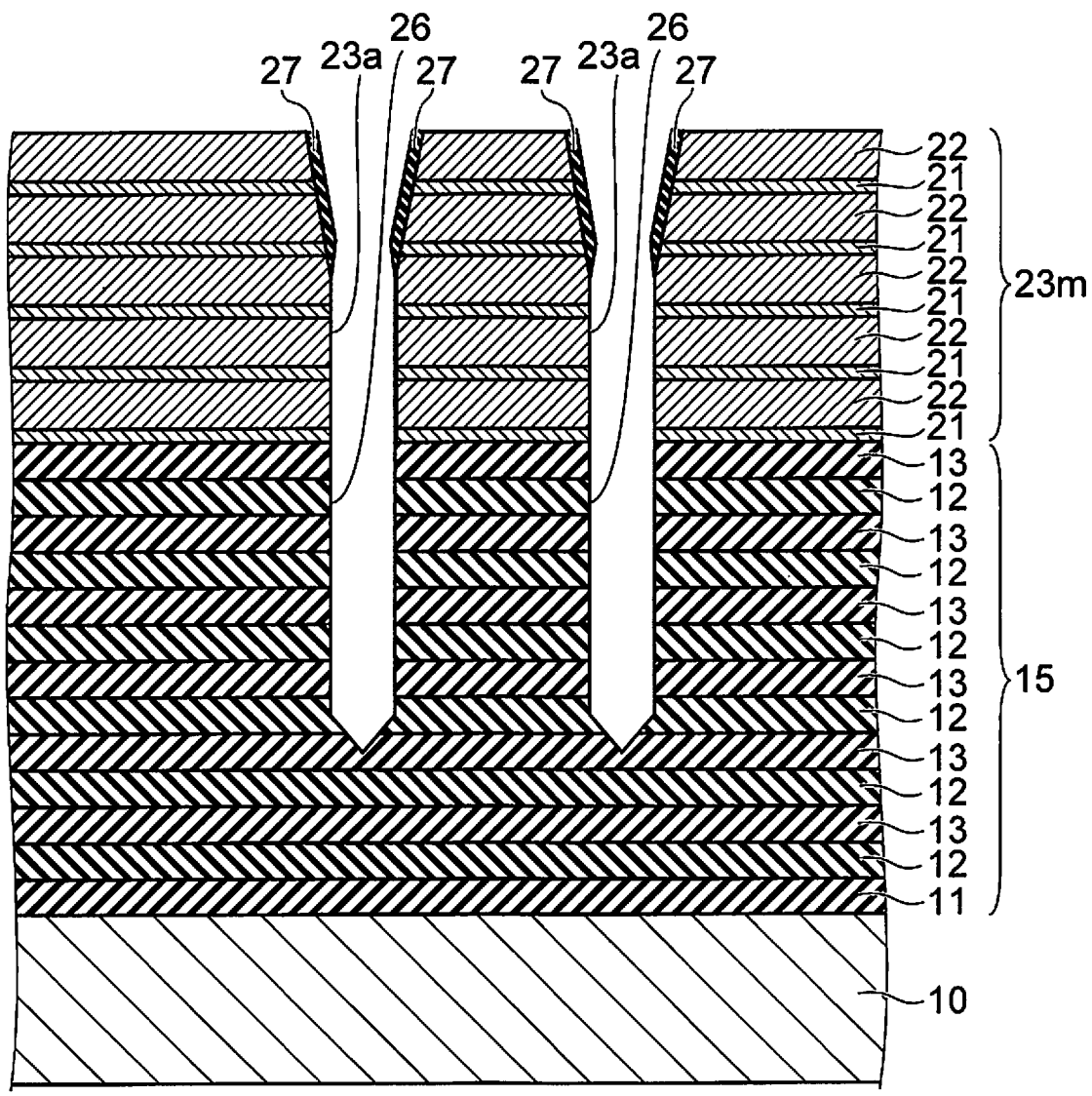

Then, as shown in FIG. 3, by performing anisotropic etching using the stacked mask film 23m as a mask, memory holes 26 are provided to the stacked body 15. As the anisotropic etching, there is performed RIE using an etching gas including, for example, fluorine and carbon. On this occasion, although the etching rate is low compared to the stacked body 15, the stacked mask film 23m is etched to some extent. When the carbon-containing tungsten film 21 is etched due to the etching of the stacked body 15, a reaction product including carbon is generated, and adheres to an inner surface of each of the opening parts 23a. Due also to this process, the protective film 27 is formed on the inner surface of each of the opening parts 23a.

When the stacked film 23m is etched due to the etching of the stacked body 15, an upper part of the inner surface of each of the opening parts 23a is processed to have a tapered shape flaring upward. However, since in the embodiment, the protective film 27 is formed on the inner surface of each of the opening parts 23a, the stacked mask film 23m is protected from etching, and thus, deformation of the opening parts 23a is inhibited.

Figure 4:
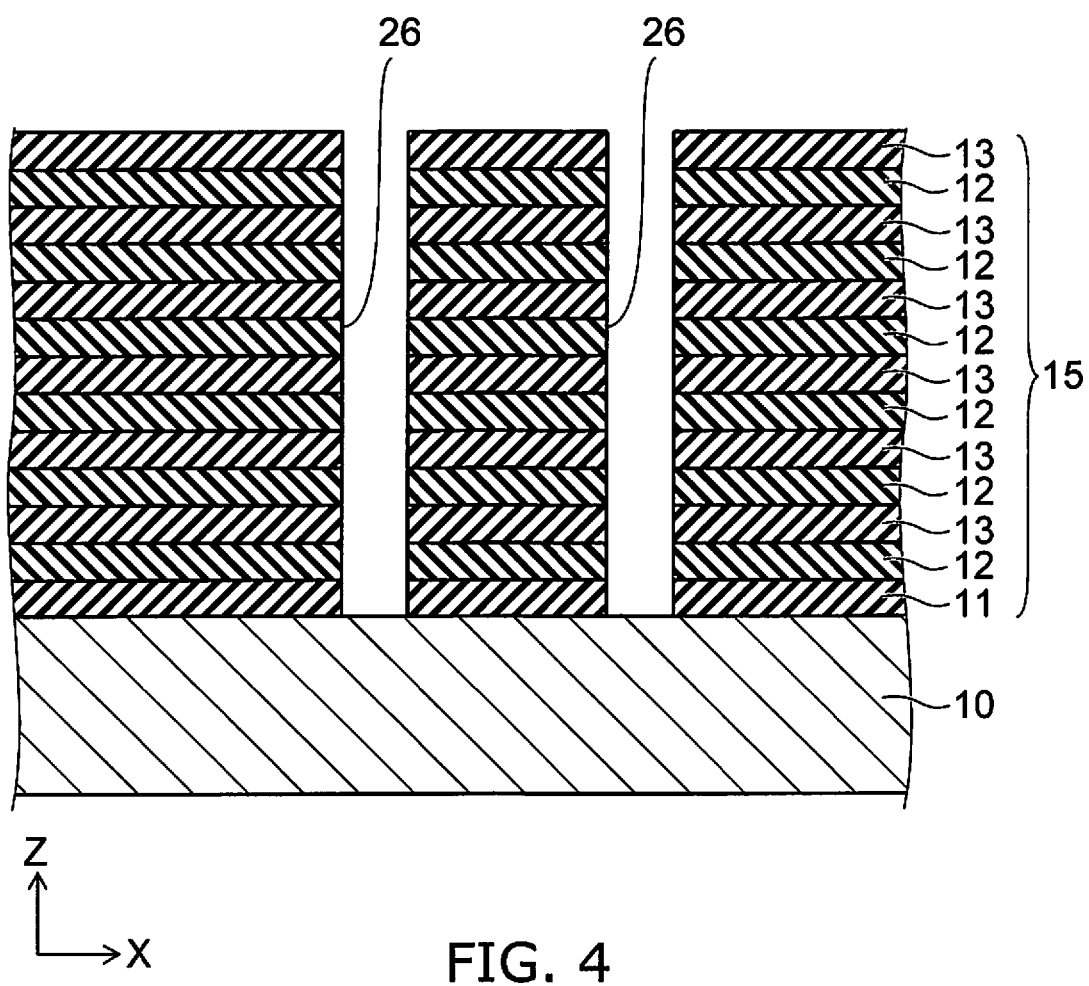

Then, as shown in FIG. 4, in the state in which the memory holes 26 reach the silicon substrate 10, the anisotropic etching is stopped. Subsequently, the stacked mask film 23m is removed together with the protective films 27 using, for example, a wet process. In such a manner, the memory holes 26 are provided to the stacked body 15.

Figure 5:
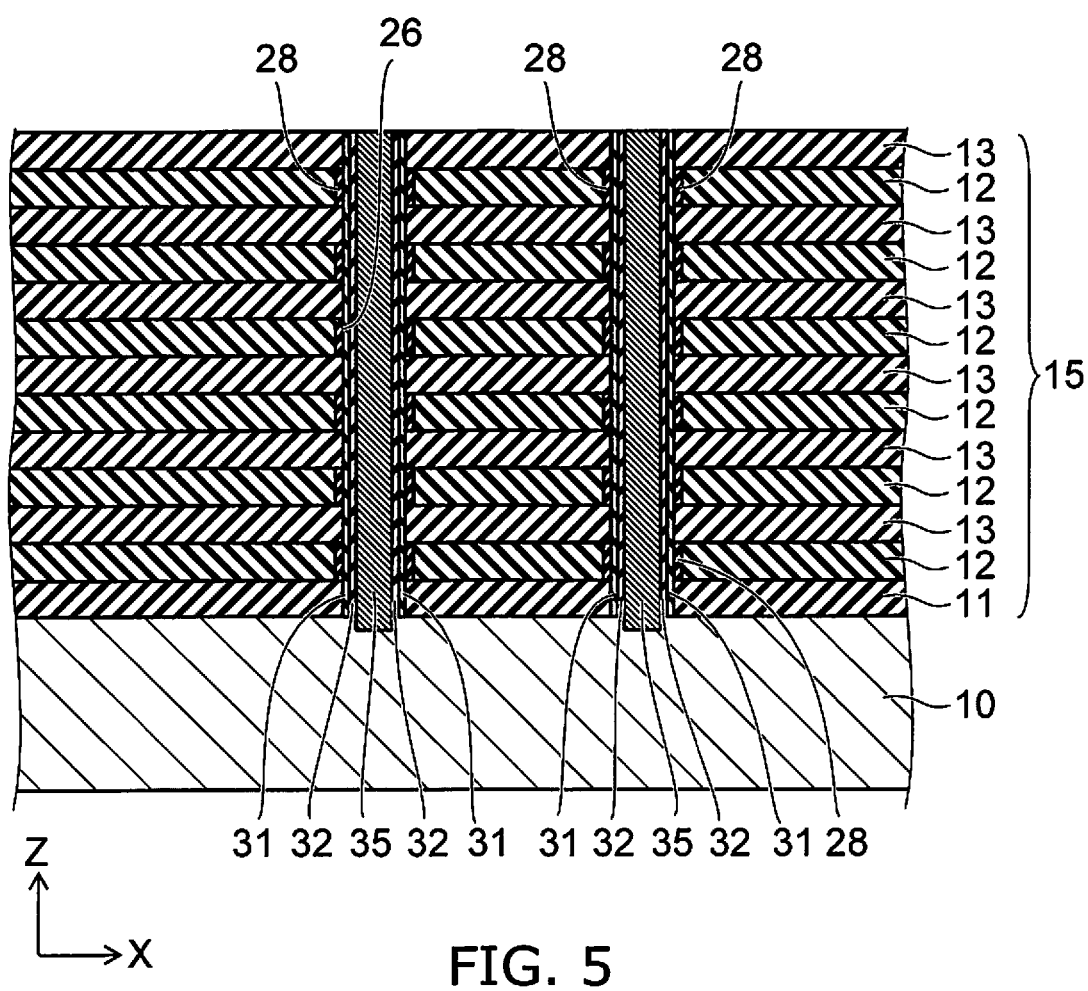

Then, as shown in FIG. 5, by performing an oxidation treatment, areas where the silicon nitride films 12 are exposed in the inner surface of each of the memory holes 26 are oxidized to form silicon oxide films 28. Then, a silicon nitride is deposited on the inner surface of each of the memory holes 26 using, for example, a CVD method to form a charge storage film 31. The charge storage film 31 is a film capable of storing the charge, and is formed of a material having trap sites of electrons, and is formed of, for example, a silicon nitride as described above.

Then, a silicon oxide, a silicon nitride, and a silicon oxide are deposited in this order using, for example, a CVD method to form a tunnel insulating film 32 on a side surface of the charge storage film 31. The tunnel insulating film 32 is a film, which has an insulating property in a normal state, and allows the tunnel current to flow when a predetermined voltage within the range of the drive voltage of the semiconductor device is applied. The tunnel insulating film 32 can also be an ONO film as described above, or can also be a single-layer silicon oxide film.

Then, by depositing silicon on a side surface of the tunnel insulating film 32, a cover silicon layer is formed. Then, the cover silicon layer, the tunnel insulating film 32, and the charge storage film 31 are removed from a surface of the bottom of each of the memory holes 26 using, for example, an RIE method to expose the silicon substrate 10. Then, by depositing the silicon, a silicon body is embedded in each of the memory holes 26. The cover silicon layer and the silicon body constitute a silicon pillar 35. It should be noted that it is also possible to form a core member made of a silicon oxide by not completely filling the memory holes 26 with the silicon body, and then depositing the silicon oxide.

Figure 6:
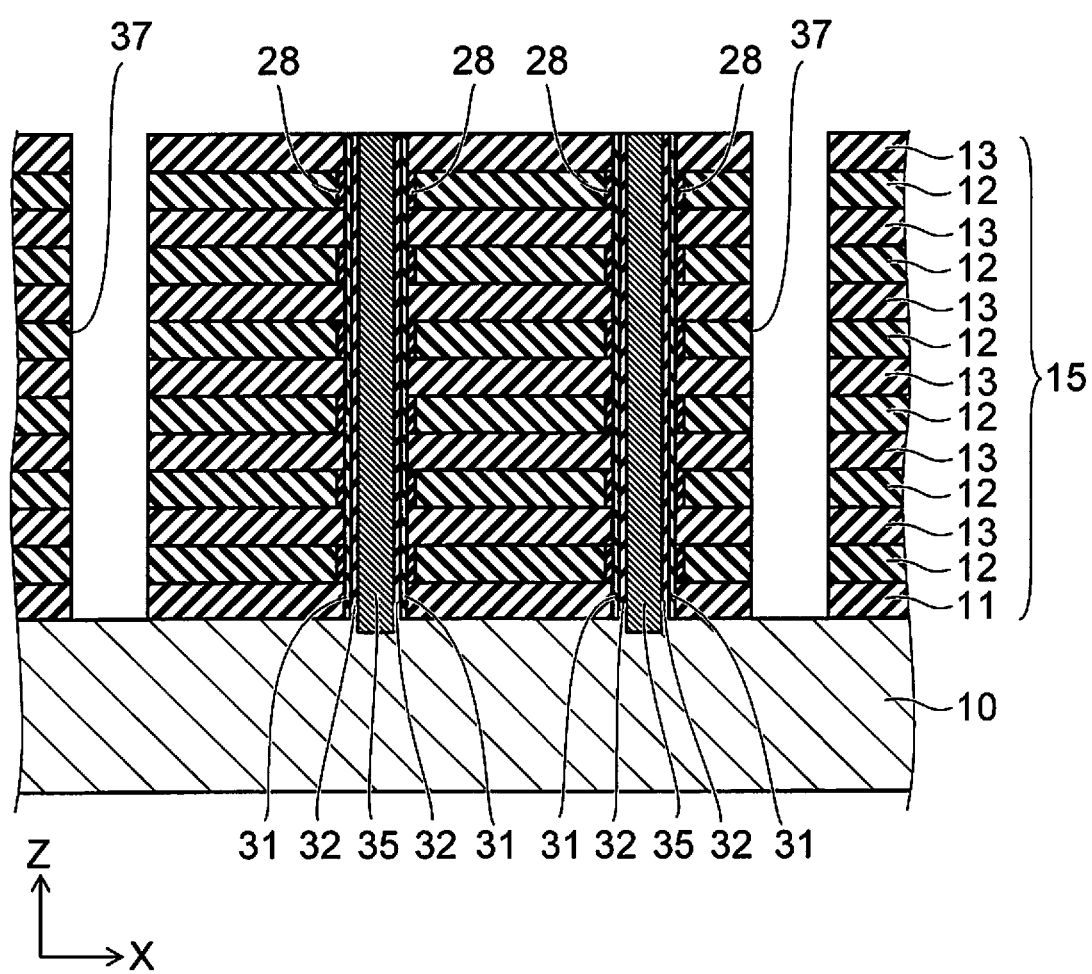

Then, as shown in FIG. 6, by forming a mask film (not shown) using a lithography method, and then performing RIE using the mask film, a plurality of trenches 37 reaching the silicon substrate 10 is formed in a part where the silicon pillar 35 is not formed in the stacked body 15. The trenches 37 extend in the Y-direction, and are terminated in the end part in the Y-direction of the stacked body 15. Since the end part in the Y-direction of the stacked body 15 is processed to have a stepped shape, the upper part of the stacked body 15 is divided by the trenches 37 in a line-and-space manner, and the lower part of the stacked body 15 is not completely divided.

Therefore, the shape becomes a comb-like shape obtained by connecting a plurality of line-shaped parts, each of which is sandwiched by the trenches 37, to each other in the end part in the Y-direction.

Figure 7:
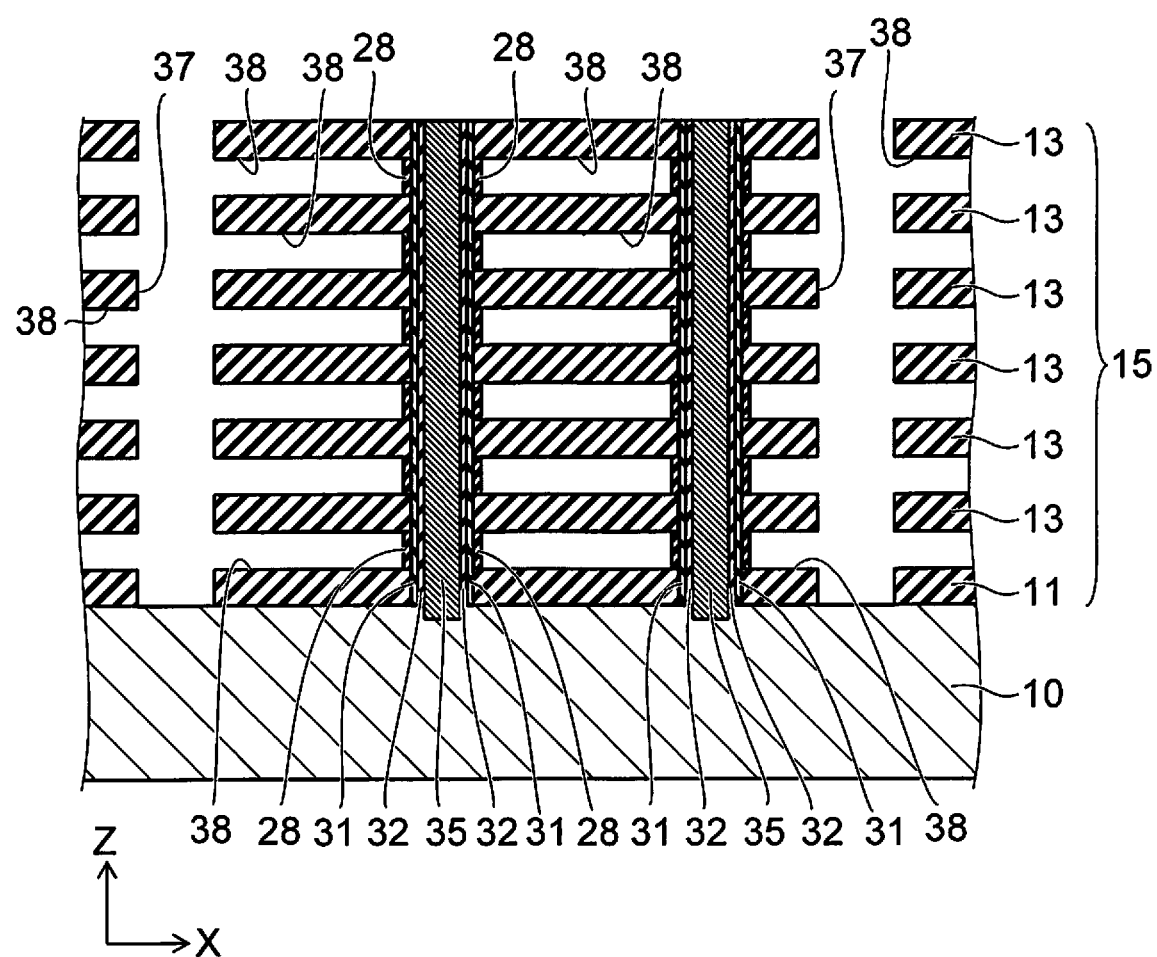

Then, as shown in FIG. 7, wet etching is performed via the trenches 37. The condition of the wet etching is set to the condition in which a silicon nitride is selectively etched with respect to a silicon oxide, and hot phosphoric acid, for example, is used as the etchant. Thus, the silicon nitride films 12 (see FIG. 6) are removed via the trenches 37 to form spaces 38. On this occasion, the silicon oxide films 11 and 12 are not substantially etched, and are exposed on the lower surfaces and the upper surfaces of the spaces 38. Further, the silicon oxide films 28 are also not substantially etched, and each function as an etch stopper for protecting the charge storage film 31. Then, a small amount of etching to the silicon oxide is performed to remove the silicon oxide films 28. Thus, the charge storage films 31 are exposed in the spaces 38. The silicon pillars 35 surrounded by the charge storage films 31 support the silicon oxide films 13 and so on to prevent the spaces 38 from getting crushed.

Figure 8:
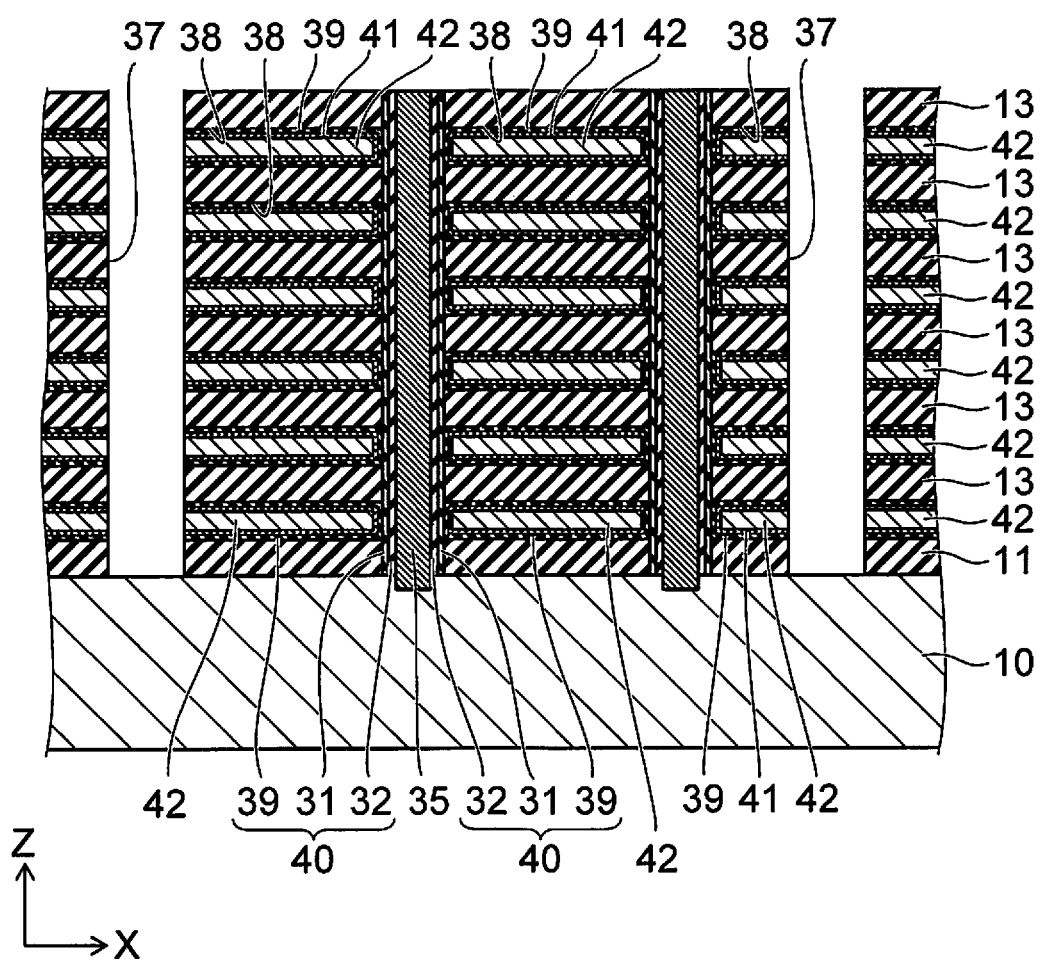

Then, as shown in FIG. 8, a silicon oxide and an aluminum oxide are deposited in this order using, for example, a CVD method. Thus, block insulating films 39 are formed on the inner surfaces of the trenches 37 and the spaces 38. The block insulating films 39 are each a film substantially preventing a current from flowing even in the case in which a voltage is applied within a range of the drive voltage of the semiconductor device. As described above, the block insulating films 39 are each a two-layer film, for example, having a silicon oxide layer 39a (see FIG. 11) and an aluminum oxide layer 39b (see FIG. 11) stacked on one another. It should be noted that the block insulating film can also be a three-layer film having a silicon oxide layer, an aluminum oxide layer, and a silicon oxide layer stacked on one another, or can also be a multilayer film having hafnium oxide layers and silicon oxide layers stacked on one another, or can also be a single-layer silicon oxide film. For example, an average dielectric constant of the entire block insulating film 39 is higher than an average dielectric constant of the entire tunnel insulating film 32. The tunnel insulating film 32, the charge storage film 31, and the block insulating film 39 constitute a memory film 40.

Then, a metal nitride such as a titanium nitride, a tantalum nitride, or a tungsten nitride is deposited using, for example, a CVD method. Thus, barrier metal layers 41 are formed on the inner surfaces of the trenches 37 and the spaces 38. The barrier metal layers 41 are formed so as not to completely fill in the trenches 37 and the spaces 38.

Then, tungsten is deposited using, for example, a CVD method to fill in the spaces 38. On this occasion, tungsten is also deposited on the side surface of each of the trenches 37. Then, by performing etching, parts deposited in the trenches 37 out of the block insulating films 39, the barrier metal layers 41, and tungsten are removed. Thus, tungsten embedded in the spaces 38 is divided into the spaces 38 to form a plurality of electrode films 42 stacked on one another.

Figure 9:
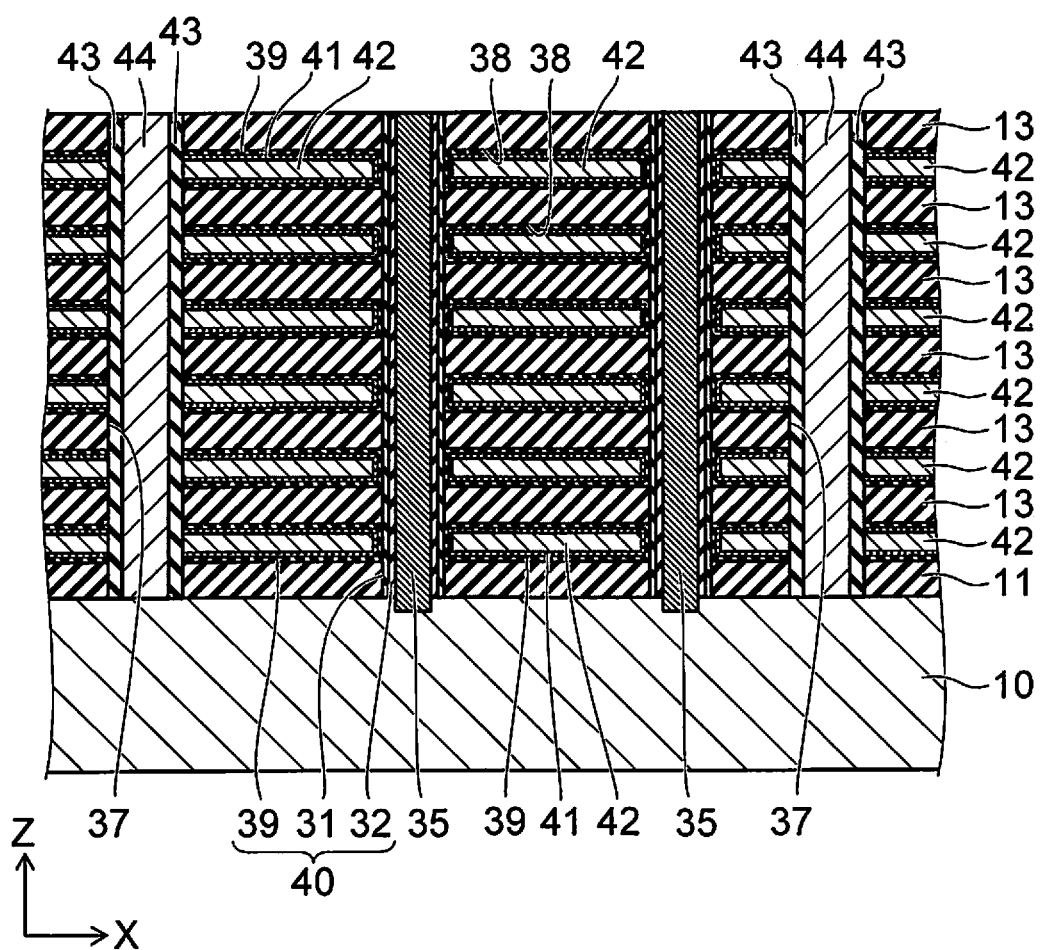

Then, as shown in FIG. 9, a silicon oxide is deposited on the inner surface of each of the trenches 37. Then, a part deposited on the bottom surface of each of the trenches 37 in the silicon oxide is removed. Thus, silicon oxide plates 43 are formed on the respective side surfaces of each of the trenches 37, and at the same time, the silicon substrate 10 is exposed on the bottom surface of each of the trenches 37. Then, the trenches 37 are filled with a conductive material such as tungsten to form source electrode plates 44.

Then, as shown in FIG. 10 and FIG. 12, a silicon oxide is deposited on the stacked body 15 to form a silicon oxide film 46. It should be noted that some of the constituents including the silicon oxide film 46 are omitted in FIG. 12 for the sake of convenience of graphical description. Then, using a lithography method and an RIE method, an opening part is formed in an area immediately above the silicon pillar 35 in the silicon oxide film 46, and then the opening part is filled with a conductive material to form a plug 47. The plug 47 is connected to the silicon pillar 35. Then, a source line 48 extending in the X-direction is formed on the silicon oxide film 46, and is connected to the source electrode plates 44 via plugs (not shown). Further, bit lines 49 each extending in the X-direction are formed on the silicon oxide film 46, and are connected to the respective plugs 47. Subsequently, the silicon wafer is diced into individual segments. In such a manner as described above, the semiconductor device 1 according to the embodiment is manufactured.

Then, a configuration of the semiconductor device 1 manufactured in such a manner as described above will be described.

As shown in FIG. 10 and FIG. 12, in the semiconductor device 1 according to the embodiment, there is provided the silicon substrate 10. On the silicon substrate 10, there is provided the stacked body 15. In the stacked body 15, the silicon oxide film 11 is provided as the lowermost layer, and the electrode films 42 and the silicon oxide films 13 are alternately stacked on the silicon oxide film 11. The electrode films 42 are each formed of, for example, tungsten.

In the stacked body 15, there is provided the plurality of source electrode plates 44 each extending in the Y-direction. The lower ends of the respective source electrode plates 44 are connected to the silicon substrate 10. The source electrode plates 44 each have a plate-like shape, the longitudinal direction, in which the shape is the longest, is parallel to the Y-direction, the width direction, in which the shape is the second longest, is parallel to the Z-direction, and the thickness direction, in which the shape is the shortest, is parallel to the X-direction. The source electrode plates 44 are each formed of, for example, tungsten (W). On the side surfaces facing to the both sides in the X-direction of each of the source electrode plates 44, there are provided the silicon oxide plates 43 each having a plate-like shape, respectively.

The shape of the end part in the Y-direction of the stacked body 15 is the stepped shape (not shown) having steps formed for the respective electrode films 42, and the source electrode plates 44 and the silicon oxide plates 43 are terminated in the end part having the stepped shape. Therefore, the shape of the electrode film 42 disposed in the upper part of the stacked body 15 is a line-and-space shape divided by the source electrode plates 44 and the silicon oxide plates 43, and the shape of the electrode film 42 disposed in the lower part of the stacked body 15 is a comb-like shape.

In the stacked body 15, there are provided the silicon pillars 35 each extending in the Z-direction. The silicon pillars 35 are each made of polysilicon, and each have a columnar shape. The lower end of each of the silicon pillars 35 is connected to the silicon substrate 10, and the upper end is exposed on the upper surface of the stacked body 15. It should be noted that the silicon pillars 35 can each have a cylindrical shape with the lower end part closed, and a core member made of, for example, a silicon oxide can also be provided in the cylindrical shape. When viewed from the Z-direction, the silicon pillars 35 are arranged at intervals along two or more lines such as four lines. The lines each extend in the Y-direction, and between the lines adjacent to each other, the positions of the silicon pillars 35 in the Y-direction are shifted as much as a half pitch from each other. In the specification, such an arrangement is referred to as a "fourfold hound's-tooth check."

On the stacked body 15, there is provided the silicon oxide film 46, and in the silicon oxide film 46, there are provided the plugs 47. On the silicon oxide film 46, there are provided the source line 48 extending in the X-direction and the plurality of bit lines 49 each extending in the X-direction. The source electrode plates 44 are connected to the source line 48 via the plugs (not shown). The silicon pillars 35 are connected to the bit lines 49 via the plugs 47, respectively. In such a manner, the silicon pillars 35 are connected between the respective bit lines 49 and the silicon substrate 10.

As shown in FIG. 11, on the side surface of each of the silicon pillars 35, there is provided the tunnel insulating film 32, and on the side surface of the tunnel insulating film 32, there is provided the charge storage film 31. On the other hand, on each of the upper surface, the lower surface, and the side surfaces facing to the silicon pillars 35 of each of the electrode films 42, there are provided the barrier metal layer 41, the aluminum oxide layer 39b, and the silicon oxide layer 39a. The aluminum oxide layer 39b and the silicon oxide layer 39a constitute the block insulating film 39, and the block insulating film 39, the charge storage film 31, and the tunnel insulating film 32 constitute the memory film 40. The silicon oxide layer 39a has contact with the charge storage film 31.

In the stacked body 15, upper one or more of the electrode films 42 divided to have the line-and-space shape each function as an upper selection gate line SGD, and at each of the crossing parts between the upper selection gate lines SGD and the silicon pillars 35, there is formed an upper selection gate transistor STD. Further, among the electrode films 42 divided to have the comb-like shape, lower one or more of the electrode films 42 each function as a lower selection gate line SGS, and at each of the crossing parts between the lower selection gate lines SGS and the silicon pillars 35, there is formed a lower selection gate transistor STS. The electrode films 42 other than the lower selection gate lines SGS or the upper selection gate lines SGD are each function as a word line WL, and at each of the crossing parts between the word lines WL and the silicon pillars 35, there is formed a memory cell transistor MC. Thus, the memory cell transistors MC are connected in series to each other along each of the silicon pillars 35, and the lower selection gate transistors STS and the upper selection gate transistors STD are connected to the respective ends thereof to form a NAND string.

Then, advantages of the embodiment will be described.

In the embodiment, in the process shown in FIG. 3, when forming the memory holes 26 by etching the stacked body 15, the stacked mask film 23m made of metal is used as the etching mask. Since the metal mask is high in etching resistance, the stacked mask film 23m can be formed thinner compared to the case of using a nonmetallic mask. As a result, the stacked mask film 23m is easy to form, and therefore, the semiconductor device 1 is easy to manufacture.

However, if the metal etching mask is used, strong stress occurs in the etching mask. Therefore, in the embodiment, as shown in FIG. 2, as the configuration of the stacked mask film 23m, there is adopted a multilayer film obtained by inserting the carbon-containing tungsten films 21 between the respective tungsten films 22 instead of the single-layer thick tungsten film. Thus, it is possible to relax the compressive stress of the stacked mask film 23m while ensuring the sufficient etch resistance. As a result, it is possible to reduce the compressive stress of the stacked mask film 23m to inhibit the warp of the silicon wafer and the exfoliation of the stacked mask film 23m. Therefore, the semiconductor device 1 is easy to manufacture.

Hereinafter, the advantage will be described in detail.

Figure 13:
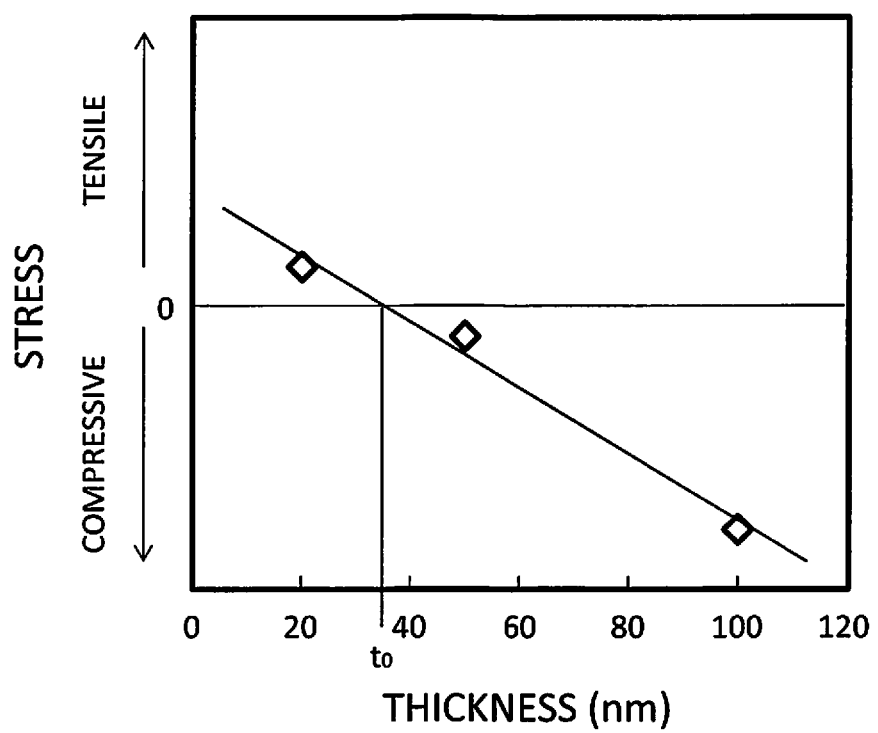
FIG. 13 is a graph chart showing a relationship between a thickness and a stress of a tungsten film with a horizontal axis representing the thickness of the tungsten film and a vertical axis representing the stress of the tungsten film.

FIG. 13 is a graph chart showing a relationship between the thickness and the stress of the tungsten film with the horizontal axis representing the thickness of the tungsten film and the vertical axis representing the stress of the tungsten film.

Figure 14:
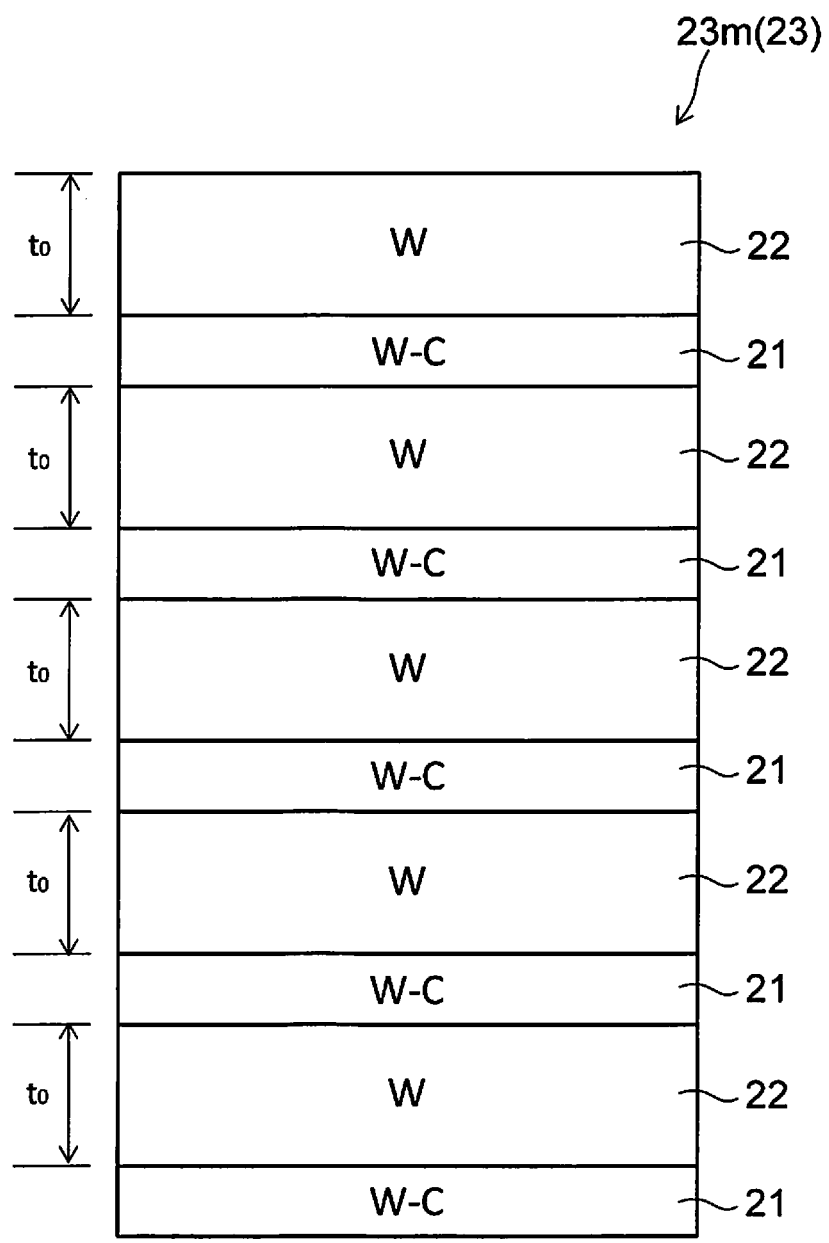
FIG. 14 is a schematic cross-sectional view showing a stacked mask film used in the first embodiment.

FIG. 14 is a schematic cross-sectional view showing the stacked mask film used in the embodiment.

As shown in FIG. 13, according to the experimental result of the inventors, there is a roughly linear function-like relationship between the thickness and the stress of the tungsten film, and the thinner the tungsten film is, the stronger the tensile stress becomes, and the thicker the tungsten film is, the stronger the compressive stress becomes. The reason is presumed that the thinner the tungsten film is made, the smaller the grain size of the tungsten film becomes, and thus, the increase in compressive stress due to the increase in the grain size can be avoided. Further, in the thickness of the tungsten film, there exists the thickness to at which the stress nearly vanishes. In the example shown in FIG. 13, the thickness to at which the stress nearly vanishes exists in a range of 30 through 40 nm.

It should be noted that the relationship between the film thickness and the stress is different by the type of metal which the film is made of, and the deposition conditions. In the case of forming the film by, for example, a CVD method, the relationship is affected by the deposition temperature and the flow ratio of the gas used. In the case of a PECVD method, the relationship is also affected by the plasma power. Further, in the case of forming the film by a sputtering method, the relationship is affected by the temperature, the flow rate of the argon gas, and the DC power. Therefore, by controlling these conditions, the relationship between the film thickness and the stress can be selected. In the case of, for example, forming the tungsten film by the PECVD method, the more the DC power is increased, the weaker the compressive stress becomes, even if the film thickness is constant.

For example, if the compressive stress caused in the carbon-containing tungsten films 21 as the stress-decoupling films is made weaker than the compressive stress caused in the tungsten films 22 as the metal films, it is possible to decoupling the stress of the tungsten films 22 by the carbon-containing tungsten film 21 to thereby reduce the stress of the entire stacked film 23. Further, if the composition of the film and the conditions are appropriately selected, it is possible to cause the tensile stress in the stress-decoupling films to thereby cancel the compressive stress caused in the metal films. Thus, the stress of the entire stacked film can further be reduced.

In the embodiment, by setting, for example, the thickness of each of the tungsten films 22 to appropriately 40 nm, and inserting the carbon-containing tungsten films 21 between the respective tungsten films 22, the stress of each of the tungsten films 22 can be approximated to zero. Further, since the tungsten films 22 are decoupled from each other by the carbon-containing tungsten films 21, it is possible to keep the stress of each of the tungsten films 22 in the near-zero state to thereby suppress the stress of the entire stacked film 23.

In contrast, if the mask film is formed of a thick single-layer tungsten film, since the thicker the tungsten film becomes, the stronger the compressive stress becomes as shown in FIG. 13, strong compressive stress is caused as the entire mask film. Thus, when the mask film has been formed, the silicon wafer largely warps. As a result, it becomes difficult to adjust the focus of exposure, and thus, the accuracy of lithography is degraded. Further, since the silicon wafer largely warps, handling in the succeeding processes becomes difficult. Further, due to the compressive stress, the mask film exfoliates in some cases. As described above, if the mask film is formed of the single-layer metal film, excessive compressive stress is caused, and the productivity of the semiconductor device drops.

Further, as shown in FIG. 3, when etching the stacked body 15, the stacked mask film 23m is also etched inevitably. On this occasion, since in the embodiment, the carbon-containing tungsten films 21 are provided in the stacked mask film 23m, the carbon-containing tungsten films 21 are etched to thereby produce the reactant including carbon. The reactant adheres to the inner surface of each of the opening parts 23a to form the protective film 27 against etching. Thus, the inner surface of each of the opening parts 23a is inhibited from being etched to deform to have a tapered shape, and it is possible to keep the shape of the opening part 23a in a preferable state until the end of the etching of the stacked body 15. As a result, the memory holes 26 can accurately be formed. Further, even in the case in which the memory holes 26 are arranged at short intervals, the deformation of one of the opening parts 23a can be inhibited from affecting adjacent one of the opening parts 23a. As a result, the arrangement intervals of the memory holes 26 can be shortened.

Further, in the embodiment, the principal component of the carbon-containing tungsten films 21 is tungsten, which is the same as the principal component of the tungsten films 22. Therefore, the etching characteristics of the carbon-containing tungsten films 21 and the etching characteristics of the tungsten films 22 are similar to each other, and the stacked film 23 is easy to etch. This also makes the semiconductor device 1 easy to manufacture.

Furthermore, in the embodiment, the silicon oxide film 13 is disposed as the uppermost layer of the stacked body 15, and the carbon-containing tungsten film 21 is disposed as the lowermost layer of the stacked film 23. Therefore, the adhesiveness between the stacked body 15 and the stacked film 23 is better compared to the case of disposing the tungsten film 22 as the lowermost layer of the stacked film 23.

It should be noted that although in the embodiment, there is described the example of forming the tungsten films 22 as the metal films, and forming the carbon-containing tungsten films 21 as the stress-decoupling films, the example is not a limitation. For example, the metal films can be formed of one or more types of metal selected from a group consisting of tungsten (W), molybdenum (Mo), tantalum (Ta), cobalt (Co), and titanium (Ti). Similarly, the stress-decoupling films can be formed of one or more types of carbon-containing metal selected from a group consisting of W—C, Mo—C, Ta—C, Co—C, and Ti—C. In order to make the etching characteristics similar to each other, the metal forming the metal films and the metal to be the principal component of the stress-decoupling films preferably coincide with each other, but are not necessarily required to coincide with each other. Further, it is also possible for the metal films and the stress-decoupling films to include other components than the metal to be the principal component or carbon. Further, the film thickness of the tungsten films 22 is not limited to the film thickness $t_0$.

First Modified Example of First Embodiment

Then, a first modified example of the first embodiment will be described.

Figure 15:
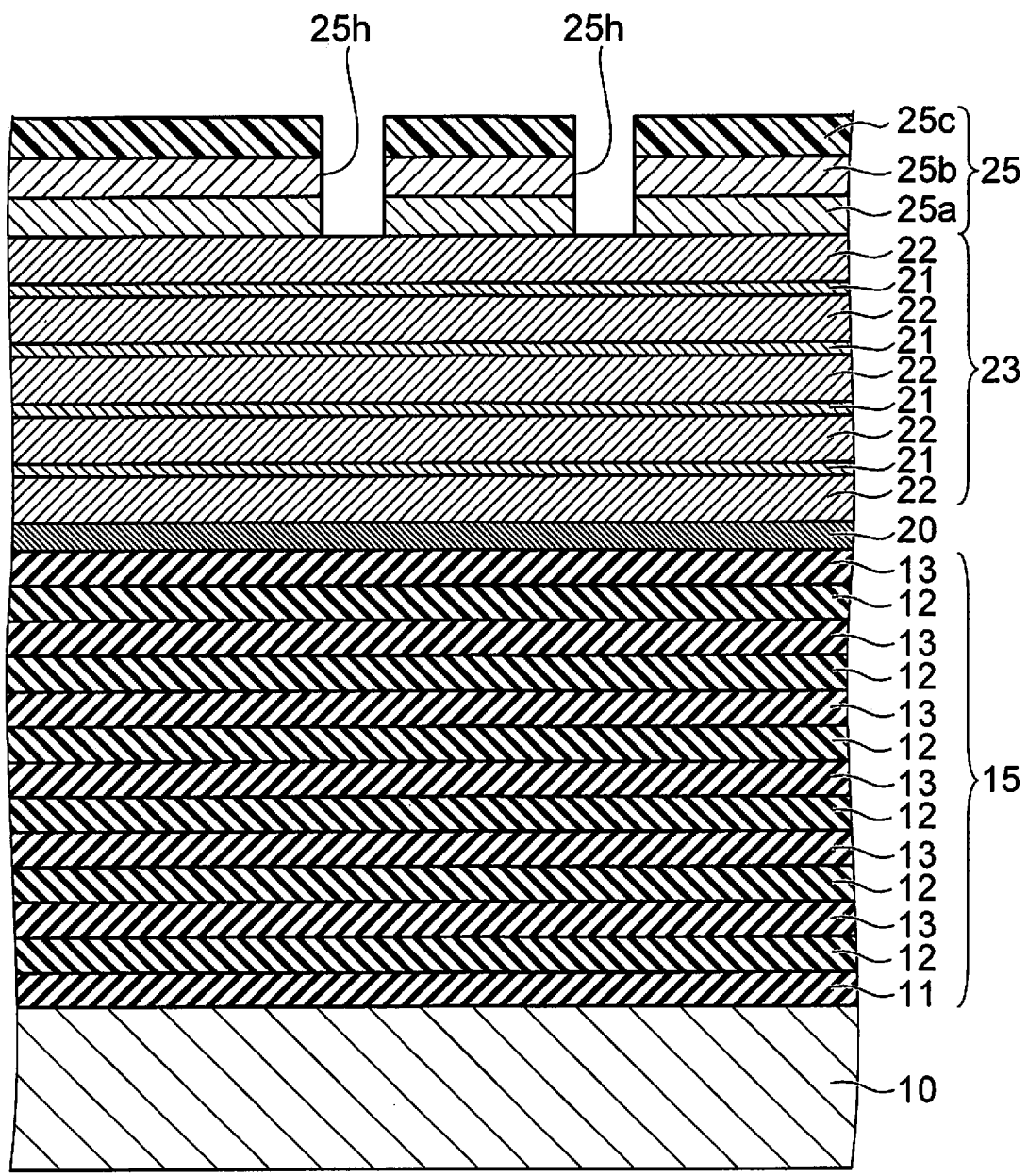
FIG. 15 is a cross-sectional view showing a method of manufacturing a semiconductor device according to a first modified example of the first embodiment.

FIG. 15 is a cross-sectional view showing a method of manufacturing a semiconductor device according to the modified example.

As shown in FIG. 15, in the modified example, a liner film 20 is formed on the stacked body 15. The liner film 20 has contact with the silicon oxide film 13. The liner film 20 is formed using, for example, a nitride of the metal constituting the metal films, or a material obtained by making the metal include nitrogen. Specifically, in the modified example, since the tungsten films 22 are formed as the metal films, the liner film 20 is formed using a tungsten nitride (WN) or nitrogen-containing tungsten (W—N). It should be noted that in the case of forming the metal films using molybdenum, tantalum, cobalt, or titanium, the liner film is formed using a molybdenum nitride (MoN) or nitrogen-containing molybdenum (Mo—N), a tantalum nitride (TaN) or nitrogen-containing tantalum (Ta—N), a cobalt nitride (CoN) or nitrogen-containing cobalt (Co—N), or a titanium nitride (TiN) or nitrogen-containing titanium (Ti—N).

Further, when forming the stacked film 23, the tungsten film 22 is formed first. The tungsten film 22 has contact with the liner film 20. Since the uppermost layer of the stacked film 23 is the tungsten film 22, in the modified example, the number of the tungsten films 22 stacked is larger by one than the number of the carbon-containing tungsten films 21 stacked.

According to the modified example, by providing the liner film 20 between the stacked body 15 and the stacked film 23, the adhesiveness between the stacked body 15 and the stacked film 23 can be improved. As a result, the exfoliation of the stacked mask film 23m can more surely be prevented.

Except the points described above, the manufacturing method, configurations, and advantages of the semiconductor device in the modified example are substantially the same as in the first embodiment described above.

Second Modified Example of First Embodiment

Then, a second modified example of the first embodiment will be described.

Figure 16:
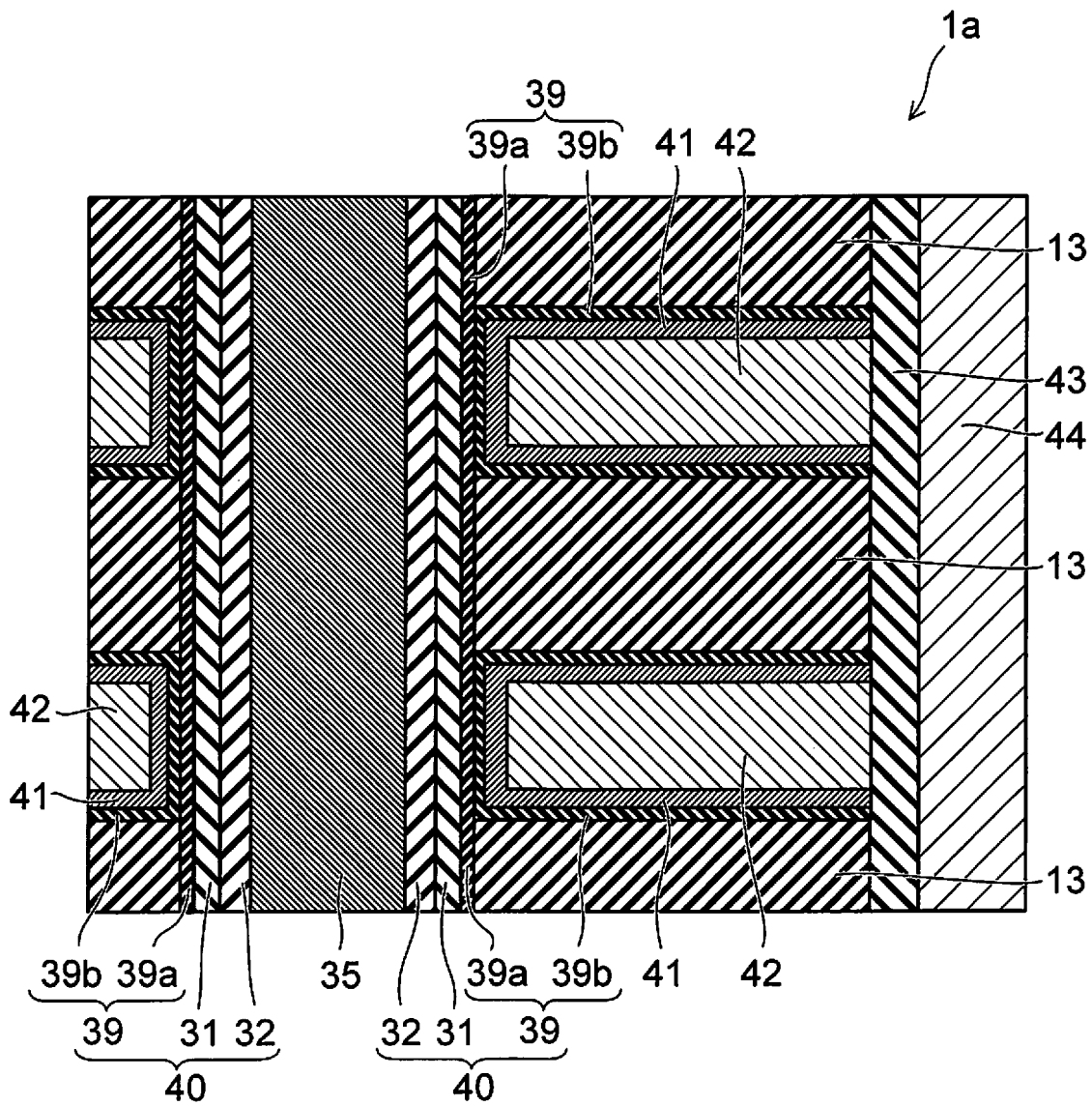
FIG. 16 is a cross-sectional view showing a semiconductor device according to a second modified example of the first embodiment.

FIG. 16 is a cross-sectional view showing a semiconductor device according to the modified example.

FIG. 16 shows a part corresponding to an area A of FIG. 10.

Firstly, the processes shown in FIG. 1 through FIG. 4 are performed.

Then, as shown in FIG. 16, a silicon oxide layer 39a is formed on the inner surface of each of the memory holes 26. Then, the charge storage film 31, the tunnel insulating film 32, and the silicon pillar 35 are formed on the side surface of the silicon oxide layer 39a using substantially the same method as those in the first embodiment.

Then, the processes shown in FIG. 6 and FIG. 7 are performed.

Then, as shown in FIG. 16, an aluminum oxide layer 39b is formed on the inner surface of the spaces 38 from which the silicon nitride films 12 have been removed.

Then, the processes shown in FIG. 8 through FIG. 10 are performed. Thus, the semiconductor device 1a according to the modified example can be manufactured.

In the modified example, out of the block insulating film 39, the silicon oxide layer 39a is formed via the memory hole 26, and the aluminum oxide layer 39b is formed via the slit 37. Thus, since the silicon oxide layer 39a becomes not to intervene between the electrode films 42 adjacent to each other in the Z-direction, miniaturization in the Z-direction can be achieved. Further, the process of forming the silicon oxide film 28 (see FIG. 5) on the inner surface of each of the memory holes 26 can be eliminated.

Except the points described above, the manufacturing method, configurations, and advantages in the modified example are substantially the same as in the first embodiment described above.

It should be noted that although in the modified example, there is described the example in which the block insulating film 39 is a two-layer film formed of the silicon oxide layer 39a and the aluminum oxide layer 39b, even in the case in which other film configurations are adopted, it is possible to form a part of the block insulating film via the memory hole 26 and to form the rest of the block insulating film via the slit 37.

Second Embodiment

Then, a second embodiment will hereinafter be described.

Figure 17:
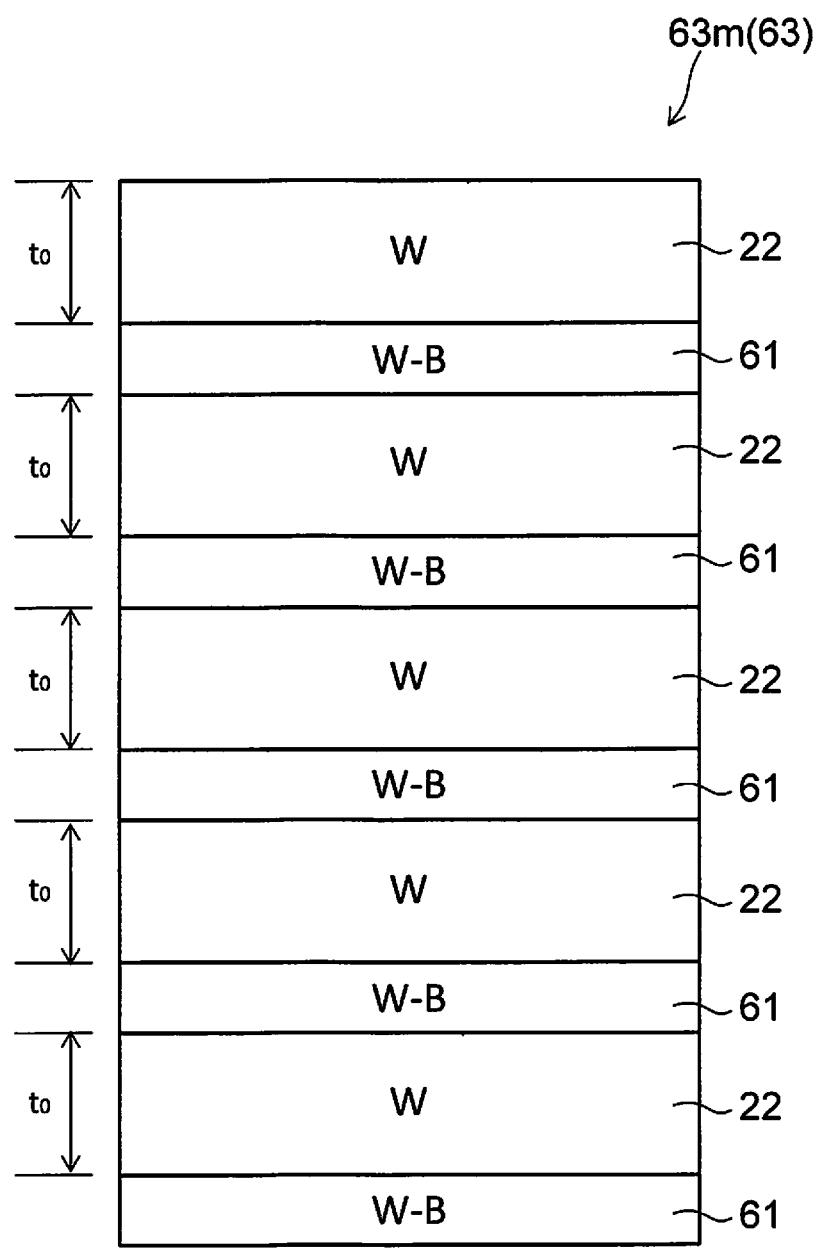
FIG. 17 is a schematic cross-sectional view showing a stacked mask film used in a second embodiment.

FIG. 17 is a schematic cross-sectional view showing the stacked mask film used in the embodiment.

As shown in FIG. 17, the embodiment is different in the configuration of the stacked mask film for forming the memory holes compared to the first embodiment described above.

Hereinafter, a method of manufacturing the semiconductor device according to the embodiment will be described.

Firstly, the stacked body 15 is formed on the silicon substrate 10 as shown in FIG. 1, and then the end part in the Y-direction is processed to have the stepped shape.

Then, as shown in FIG. 17, a boron-containing tungsten film 61 consisting primarily of tungsten and including boron (B) is formed on the stacked body 15 (see FIG. 1). The boron concentration in the boron-containing tungsten film 61 is set to such a concentration that a compound (W—B compound) of tungsten and boron is formed, but single-phase boron is not precipitated, and is set to, for example, 1 atomic percent or higher, and 66 atomic percent or lower.

The boron-containing tungsten film 61 is formed using, for example, a plasma CVD method. On this occasion, as a source gas of boron, there can be used, for example, diborane ($B_2H_6$), boron trifluoride ($BF_3$), or pentaborane ($B_5H_9$). The source gas and the reducing gas of tungsten are arranged to be substantially the same as those in the first embodiment described above.

Then, the tungsten film 22 made of tungsten is formed on the boron-containing tungsten film 61 using, for example, a plasma CVD method. The tungsten film 22 is formed to be thicker than the boron-containing tungsten film 61. It should be noted that the boron-containing tungsten film 61 and the tungsten film 22 can also be formed using a sputtering method. In this case, the boron-containing film 61 and the tungsten film 22 are separately formed by, for example, switching the target.

Thereafter, the boron-containing tungsten films 61 and the tungsten films 22 are alternately formed to form a stacked film 63. It should be noted that in the tungsten film 22, boron may inevitably diffuse from the boron-containing tungsten film 61 in some cases, but the boron concentration in the tungsten film 22 is lower than the boron concentration in the boron-containing tungsten film 61.

Then, by forming the mask 25 (see FIG. 1) on the stacked film 63, and then performing anisotropic etching such as RIE using the mask 25, the stacked film 63 is patterned to form the stacked mask film 63m. It should be noted that just five pairs each formed of the boron-containing tungsten film 61 and the tungsten film 22 are shown in FIG. 17 for the sake of convenience of graphical description, but this configuration is not a limitation. It is sufficient that, for example, as shown in FIG. 13, a preliminary experiment is performed to obtain the film thickness of the tungsten film at which the stress becomes weak, and then the number of the boron-containing tungsten films 61 and the tungsten films 22 stacked on one another is determined so that the etch resistance desired for the stacked mask film 63*m* is realized.

The succeeding processes are substantially the same as those of the first embodiment described above. Further, the configuration of the semiconductor device manufactured in the embodiment is substantially the same as in the first embodiment.

Also in the embodiment, similarly to the first embodiment described above, since the stacked mask film 63*m* using tungsten as the base material is used when forming the memory holes 26, the stacked mask film 63*m* can be formed thinner compared to the case of using a nonmetallic mask.

Further, in the stacked mask film 63*m*, since the boron-containing tungsten films 61 are inserted between the respective tungsten films 22, the compressive stress can be relaxed while ensuring the sufficient etch resistance. As a result, the warp of the silicon wafer and the exfoliation of the stacked mask film 63*m* can be suppressed.

Further, in the embodiment, since the boron-containing tungsten films 61 are provided in the stacked mask film 63*m*, the reactant including boron is produced when the boron-containing tungsten films 61 are etched, and the protective film is formed on the inner surface of each of the opening parts of the stacked mask film 63*m*. Thus, it is possible to inhibit the inner surface of each of the opening parts from being etched and deformed to have a tapered shape, and thus, the memory holes 26 can accurately be formed.

Furthermore, in the embodiment, the principal component of the boron-containing tungsten films 61 is tungsten, which is the same as the principal component of the tungsten films 22. Therefore, the stacked film 63 is easy to etch.

Except the points described above, the manufacturing method and the advantages of the embodiment are substantially the same as in the first embodiment described above.

Third Embodiment

Then, a third embodiment will be described.

Figure 18:
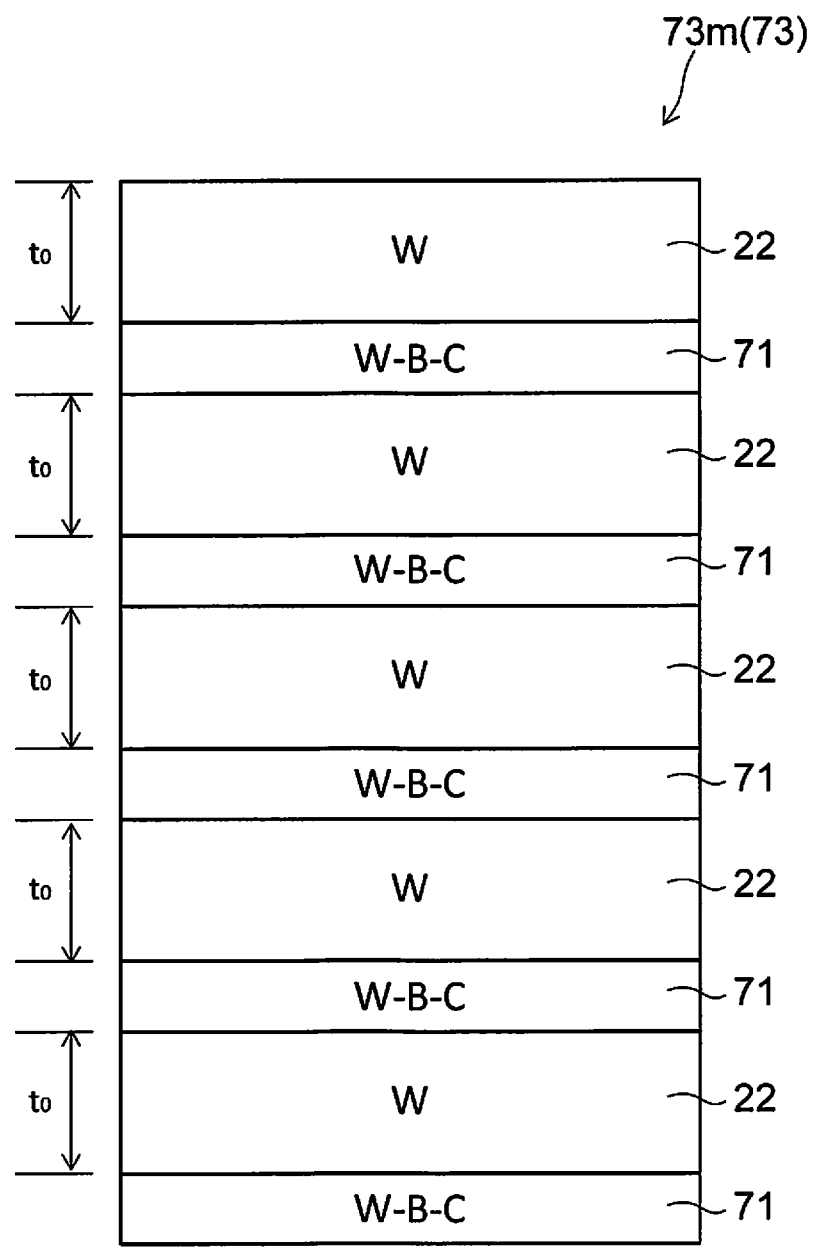
FIG. 18 is a schematic cross-sectional view showing a stacked mask film used in a third embodiment.

FIG. 18 is a schematic cross-sectional view showing the stacked mask film used in the embodiment.

As shown in FIG. 18, the embodiment is different in the configuration of the stacked mask film for forming the memory holes compared to the first and second embodiments described above.

As shown in FIG. 18, in the embodiment, a carbon-boron-containing tungsten film 71 consisting primarily of tungsten and including boron (B) and carbon (C) is formed on the stacked body 15 (see FIG. 1). The total concentration of carbon and boron in the carbon-boron-containing tungsten film 71 is set to such a concentration that each of carbon and boron forms a compound with tungsten, but single-phase carbon and single-phase boron are not precipitated. For example, the carbon concentration and the boron concentration are each set to 1 atomic percent or higher. Further, assuming the carbon concentration in the carbon-boron-containing tungsten film 71 as x atomic percent, and the boron concentration as y atomic percent, the concentrations x and y are set so as to fulfill the following formula.

$$100 \geq 2x + (3/2)y$$

The carbon-boron-containing tungsten film 71 is formed using, for example, a plasma CVD method. On this occasion, for example, the source gas of tungsten, the source gas of carbon, and the reducing gas are arranged to be substantially the same as those in the first embodiment. The source gas of boron is arranged to be substantially the same as that in the second embodiment.

Then, the tungsten film 22 made of tungsten is formed on the carbon-boron-containing tungsten film 71 using, for example, a plasma CVD method. The tungsten film 22 is formed to be thicker than the carbon-boron-containing tungsten film 71. It should be noted that the carbon-boron-containing tungsten film 71 and the tungsten film 22 can also be formed using a sputtering method. In this case, for example, the carbon-boron-containing tungsten film 71 is formed by performing sputtering using tungsten including carbon and boron (W—B—C) as a target, and the tungsten film 22 is formed by performing sputtering using tungsten as a target.

Thereafter, the carbon-boron-containing tungsten films 71 and the tungsten films 22 are alternately formed to form a stacked film 73. It should be noted that in the tungsten film 22, carbon and boron may inevitably diffuse from the carbon-boron-containing tungsten film 71 in some cases, but the total concentration of carbon and boron in the tungsten film 22 is lower than the total concentration of carbon and boron in the carbon-boron-containing tungsten film 71. Then, by patterning the stacked film 73, the stacked mask film 73*m* is formed.

Also in the embodiment, the reactant including carbon and boron is produced when the carbon-boron-containing tungsten film 71 is etched, and the protective film is formed on the inner surface of each of the opening parts of the stacked mask film 73*m*. Thus, the memory holes 26 can accurately be formed.

Except the points described above, the manufacturing method, configurations, and advantages of the semiconductor device in the embodiment are substantially the same as in the first embodiment described above.

Fourth Embodiment

Then, a fourth embodiment will be described.

Figure 19:
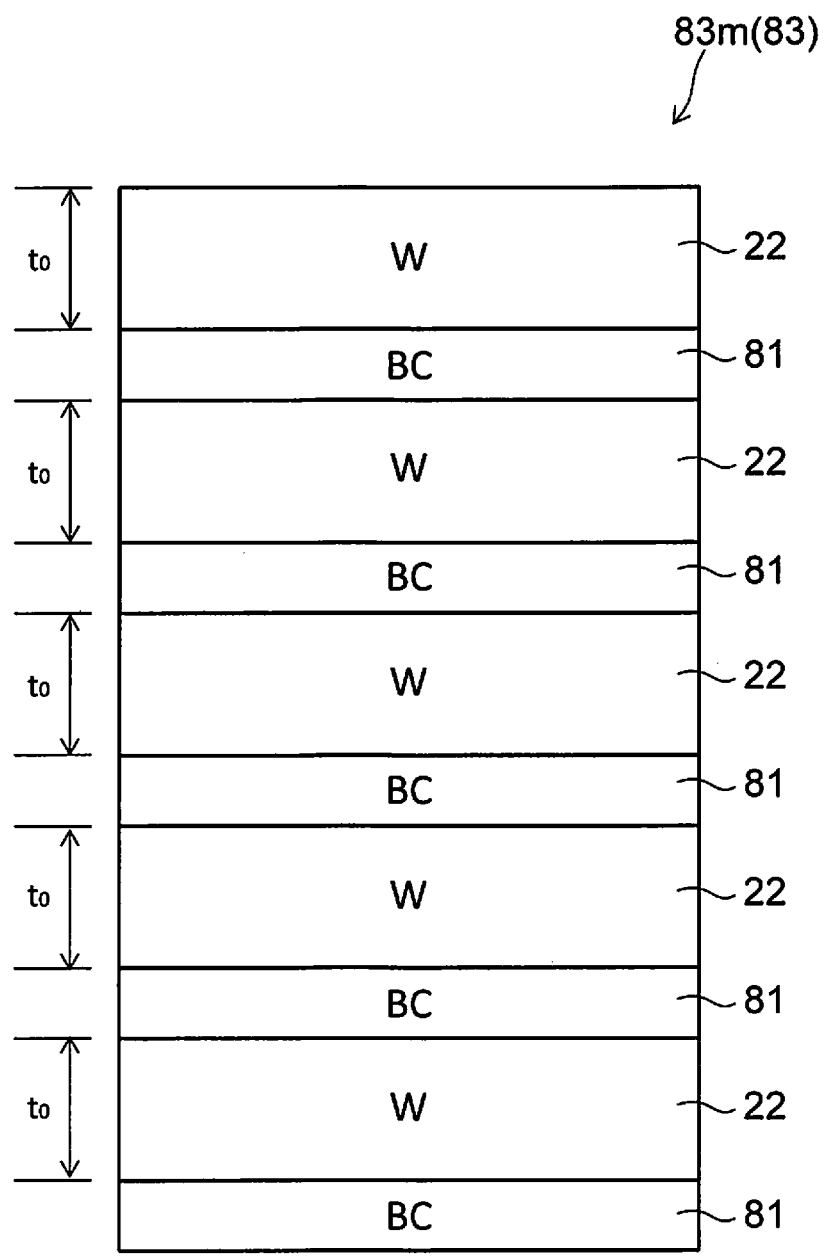
FIG. 19 is a schematic cross-sectional view showing a stacked mask film used in a fourth embodiment.

FIG. 19 is a schematic cross-sectional view showing the stacked mask film used in the embodiment.

As shown in FIG. 19, the embodiment is different in the configuration of the stacked mask film for forming the memory holes compared to the first through third embodiments described above.

As shown in FIG. 19, in the embodiment, a boron carbide film 81 consisting primarily of boron carbide (BC) is formed on the stacked body 15 (see FIG. 1). The concentration of boron carbide in the boron carbide film 81 is arranged to be, for example, 50 atomic percent or higher. The boron carbide film 81 is formed using, for example, a plasma CVD method. On this occasion, for example, the source gas of carbon and the reducing gas are arranged to be substantially the same as those in the first embodiment. The source gas of boron is arranged to be substantially the same as that in the second embodiment. It should be noted that the boron carbide film 81 can also be formed using a sputtering method.

Then, the tungsten film 22 made of tungsten is formed on the boron carbide film 81 using, for example, a plasma CVD method. The tungsten film 22 is formed to be thicker than the boron carbide film 81.

Thereafter, the boron carbide films 81 and the tungsten films 22 are alternately formed to form a stacked film 83. It should be noted that in the tungsten film 22, boron and carbon may inevitably diffuse from the boron carbide film 81 in some cases, but the total concentration of carbon and boron in the tungsten film 22 is lower than the total concentration of carbon and boron in the boron carbide film 81. Further, in the boron carbide film 81, tungsten may inevitably diffuse from the tungsten film 22 in some cases, but the tungsten concentration in the boron carbide film 81 is lower than the tungsten concentration in the tungsten film 22. Then, by patterning the stacked film 83, the stacked mask film 83m is formed.

Also in the embodiment, the reactant including boron and carbon is produced when the boron carbide film 81 is etched, and the protective film is formed on the inner surface of each of the opening parts of the stacked mask film 83m. Thus, the memory holes 26 can accurately be formed.

Further, in the embodiment, since the boron carbide films 81 high in hardness are provided in the stacked mask film 83m, the etch resistance of the stacked mask film 83m is high, and the stacked mask film 83m can be formed thinner accordingly.

Except the points described above, the manufacturing method, configurations, and advantages of the semiconductor device in the embodiment are substantially the same as in the first embodiment described above.

Fifth Embodiment

Then, a fifth embodiment will be described.

Figure 20:
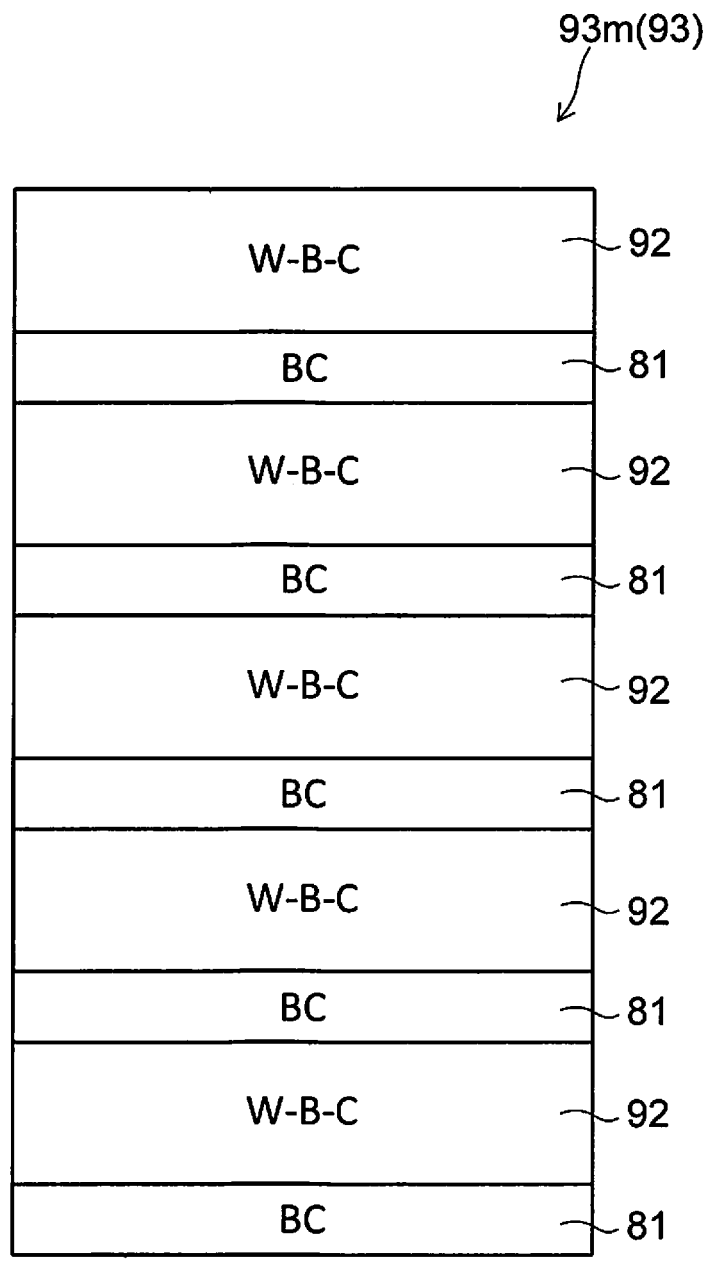
FIG. 20 is a schematic cross-sectional view showing a stacked mask film used in a fifth embodiment.

FIG. 20 is a schematic cross-sectional view showing the stacked mask film used in the embodiment.

As shown in FIG. 20, the embodiment is different in the configuration of the stacked mask film for forming the memory holes compared to the fourth embodiment described above.

As shown in FIG. 20, in the embodiment, the boron carbide film 81 consisting primarily of boron carbide (BC) is formed on the stacked body 15 (see FIG. 1). Then, a carbon-boron-containing tungsten film 92 consisting primarily of tungsten and including boron (B) and carbon (C) is formed on the boron carbide film 81. The method of forming the carbon-boron-containing tungsten film 92 is substantially the same as the method of forming the carbon-boron-containing tungsten film 71 in the third embodiment. The method of forming the boron carbide film 81 is substantially the same as in the fourth embodiment. The carbon-boron-containing tungsten film 92 is formed to be thicker than the boron carbide film 81.

Thereafter, the boron carbide films 81 and the carbon-boron-containing tungsten films 92 are alternately formed to form a stacked film 93. It should be noted that in the boron carbide film 81, tungsten may inevitably diffuse from the carbon-boron-containing tungsten film 02 in some cases, but the tungsten concentration in the boron carbide film 81 is lower than the tungsten concentration in the carbon-boron-containing tungsten film 92. Further, the total concentration of carbon and boron in the carbon-boron-containing tungsten film 92 is lower than the total concentration of carbon and boron in the boron carbide film 81. Then, by patterning the stacked film 93, the stacked mask film 93m is formed.

Except the points described above, the manufacturing method, configurations, and advantages of the semiconductor device in the embodiment are substantially the same as in the fourth embodiment described above.

It should be noted that the second through fifth embodiments can also be put into practice in combination with the first modified example and the second modified example of the first embodiment. Specifically, in the second through fifth embodiments, it is also possible to provide the liner film 20 as in the first modified example (see FIG. 15) of the first embodiment. Further, in the second through fifth embodiments, it is also possible to form a part of the block insulating film 39 from the memory hole 26 side as in the second modified example (see FIG. 16) of the first embodiment. Further, also in the second through fifth embodiments, similarly to the first embodiment, the metal constituting the metal films and the stress-decoupling films is not limited to tungsten, but can also be, for example, molybdenum, tantalum, cobalt, or titanium.

Further, although in each of the embodiments described above, there is described the example of manufacturing the stacked-type nonvolatile semiconductor memory device as, the semiconductor device, this example is not a limitation, and each of the embodiments can be applied to a process including processing high in aspect ratio.

According to the embodiments described hereinabove, it is possible to realize the method of manufacturing the semiconductor device easy to manufacture.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, comprising:
    forming a first film including a first metal above a processing target member;
    forming a second film including two or more types of element out of a second metal, carbon, and boron above the first film, and the second film including carbon and boron as the element;
    forming a third film including the first metal above the second film;
    forming a mask film by providing an opening part to a stacked film including the first film, the second film and the third film; and
    processing the processing target member by performing etching using the mask film as a mask,
    the first film and the third film being lower in total concentration of carbon and boron than the second film.

2. The method according to claim 1, further comprising:
    forming a fourth film including two or more types of element out of the second metal, carbon, and boron above the processing target member,
    the first film being formed above the fourth film, and
    the stacked film including the fourth film.

3. The method according to claim 2, wherein
    a silicon oxide is exposed on an upper surface of the processing target member.

4. The method according to claim 1, further comprising:
    forming a fourth film including the first metal and nitrogen on the processing target member,
    the first film being formed on the fourth film, and
    the opening part being provided also to the fourth film in the forming of the mask film.

5. The method according to claim 1, wherein
    the forming of the second film and the forming of the third film are alternately performed.

6. The method according to claim 5, wherein
    the third film is formed thicker than the second film.

7. The method according to claim 1, wherein
the second metal and the first metal are the same in type.

8. The method according to claim 1, wherein
the first metal and the second metal are each selected from a group consisting of tungsten, molybdenum, tantalum, cobalt, and titanium.

9. The method according to claim 1, wherein the first film and the third film further include carbon and boron.

10. The method according to claim 1, wherein
insulating films and sacrifice films are alternately stacked above a substrate in the processing target member,
the processing of the processing target member includes forming a hole penetrating the insulating films and the sacrifice films and reaching the substrate, and
the method further comprising:
forming a charge storage film on an inner surface of the hole;
forming a tunnel insulating film on a side surface of the charge storage film;
forming a semiconductor pillar on a side surface of the tunnel insulating film;
forming an opening part penetrating the insulating films and the sacrifice films after the forming of the semiconductor pillar;
removing the sacrifice films by performing etching via the opening part; and
forming electrode films in spaces from which the sacrifice films have been removed.

11. A method of manufacturing a semiconductor device, comprising:
forming a stacked body by alternately forming first layers and second layers above a substrate;
forming a first film including carbon and boron above the stacked body;
forming a second film including carbon and boron above the first film, the second film being higher in total concentration of carbon and boron than the first film;
forming a mask film by providing an opening part to a stacked film including the first film, and the second film;
forming a hole penetrating the first layers and the second layers and reaching the substrate by performing etching using the mask film as a mask;
forming a charge storage film on an inner surface of the hole;
forming a tunnel insulating film on a side surface of the charge storage film; and
forming a semiconductor pillar on a side surface of the tunnel insulating film.

12. A method of manufacturing a semiconductor device, comprising:
forming a first film including carbon and boron above a processing target member;
forming a second film including carbon and boron above the first film, the second film is higher in total concentration of carbon and boron than the first film;
forming a third film including carbon and boron above the second film;
forming a mask film by providing an opening part to a stacked film including the first film, the second film, and the third film;
processing the processing target member by performing etching using the mask film as a mask.

13. The method according to claim 12, further comprising:
forming a fourth film including two or more types of element out of the second metal, carbon, and boron above the processing target member,
the first film being formed above the fourth film, and
the stacked film including the fourth film.

14. The method according to claim 13, wherein
a silicon oxide is exposed on an upper surface of the processing target member.

15. The method according to claim 12, further comprising:
forming a fourth film including the first metal and nitrogen on the processing target member,
the first film being formed on the fourth film, and
the opening part being provided also to the fourth film in the forming of the mask film.

16. The method according to claim 12, wherein
the forming of the second film and the forming of the third film are alternately performed.

17. The method according to claim 16, wherein
the third film is formed thicker than the second film.

18. The method according to claim 12, wherein
the second metal and the first metal are the same in type.

19. The method according to claim 12, wherein
the first metal and the second metal are each selected from a group consisting of tungsten, molybdenum, tantalum, cobalt, and titanium.

* * * * *